(12) United States Patent
Yamazaki et al.

(10) Patent No.: US 6,680,223 B1
(45) Date of Patent: *Jan. 20, 2004

(54) SEMICONDUCTOR DEVICE AND METHOD OF MANUFACTURING THE SAME

(75) Inventors: Shunpei Yamazaki, Tokyo (JP); Jun Koyama, Kanagawa (JP); Takeshi Fukunaga, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/645,578

(22) Filed: Aug. 25, 2000

Related U.S. Application Data

(62) Division of application No. 09/157,939, filed on Sep. 22, 1998, now Pat. No. 6,121,660.

(30) Foreign Application Priority Data

Sep. 23, 1997 (JP) ............................................. 9-276576
Sep. 29, 1997 (JP) ............................................. 9-282562

(51) Int. Cl.[7] .......................... H01L 21/00; H01L 21/84
(52) U.S. Cl. ...................... 438/149; 438/158; 438/164; 438/486; 438/713; 438/766
(58) Field of Search ................. 438/149, 158, 438/143, 144, 166, 164, 412, 713, 766, 486, 151, 153, 154, 159, 162; 257/57, 336

(56) References Cited

U.S. PATENT DOCUMENTS

| | | | | |
|---|---|---|---|---|
| 5,457,058 A | | 10/1995 | Yonehara | |
| 5,595,944 A | * | 1/1997 | Zhang et al. | 438/158 |
| 5,643,826 A | | 7/1997 | Ohtani et al. | |
| 5,677,211 A | * | 10/1997 | Kaneko | 438/158 |
| 5,825,050 A | * | 10/1998 | Hirakawa | 257/57 |
| 5,828,082 A | | 10/1998 | Wu | |
| 5,904,509 A | | 5/1999 | Zhang et al. | |
| 5,936,278 A | * | 8/1999 | Hu et al. | 257/336 |
| 6,013,930 A | | 1/2000 | Yamazaki et al. | |
| 6,197,624 B1 | | 3/2001 | Yamazaki | |
| 6,204,535 B1 | | 3/2001 | Yamazaki et al. | |
| 6,218,219 B1 | * | 4/2001 | Yamazaki et al. | 438/149 |
| 6,407,431 B2 | | 6/2002 | Yamazaki et al. | |

FOREIGN PATENT DOCUMENTS

| JP | 7-130652 | 5/1995 |
|---|---|---|
| JP | 8-15686 | 1/1996 |
| JP | 8-306639 | 11/1996 |

OTHER PUBLICATIONS

Related U.S. Patent Application Ser. No. 09/797,952.
U.S. application Ser. No. 10/141,821, including specification, drawing, and filing receipt, "Semiconductor Device and Fabrication Method Thereof" Shunpei Yamazaki et al., May 10, 2002.

* cited by examiner

*Primary Examiner*—Phat X. Cao
*Assistant Examiner*—Theresa T. Doan
(74) *Attorney, Agent, or Firm*—Eric J. Robinson; Robinson Intellectual Property Law Office, P.C.

(57) ABSTRACT

In a bottom gate type semiconductor device made of a semiconductor layer with crystal structure, source/drain regions are constructed by a lamination layer structure including a first conductive layer ($n^+$ layer), a second conductive layer ($n^-$ layer) having resistance higher than the first conductive layer, and an intrinsic or substantially intrinsic semiconductor layer (i layer). At this time, the $n^-$ layer acts as LDD region, and the i layer acts as an offset region is a film thickness direction.

37 Claims, 25 Drawing Sheets

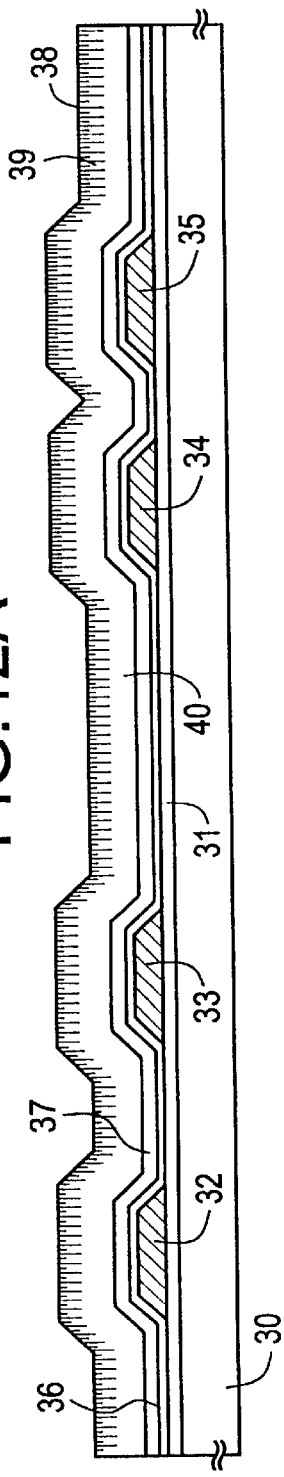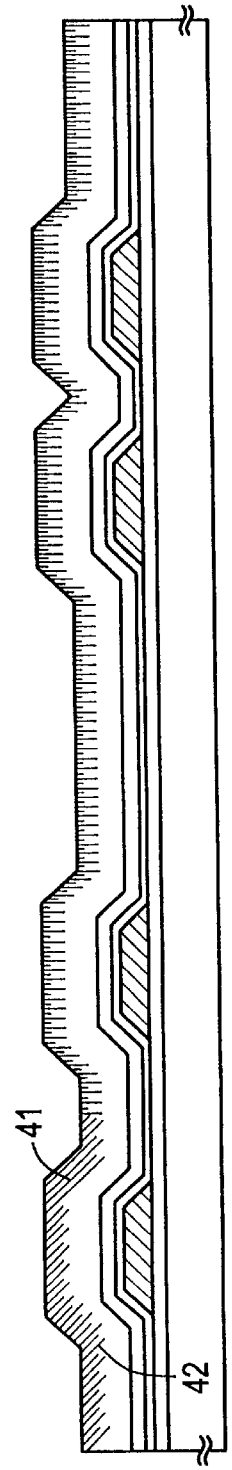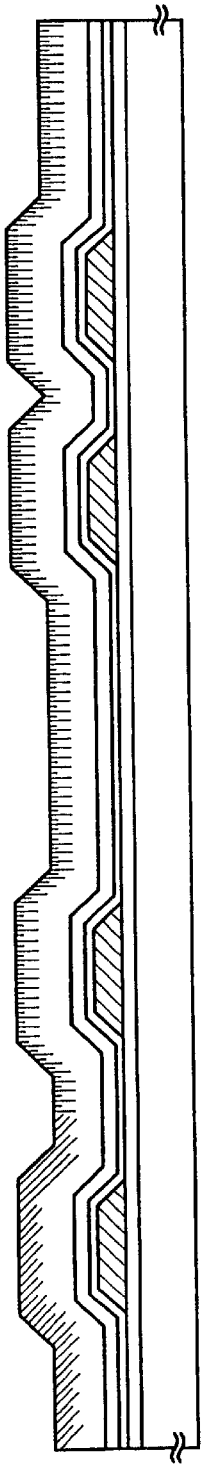

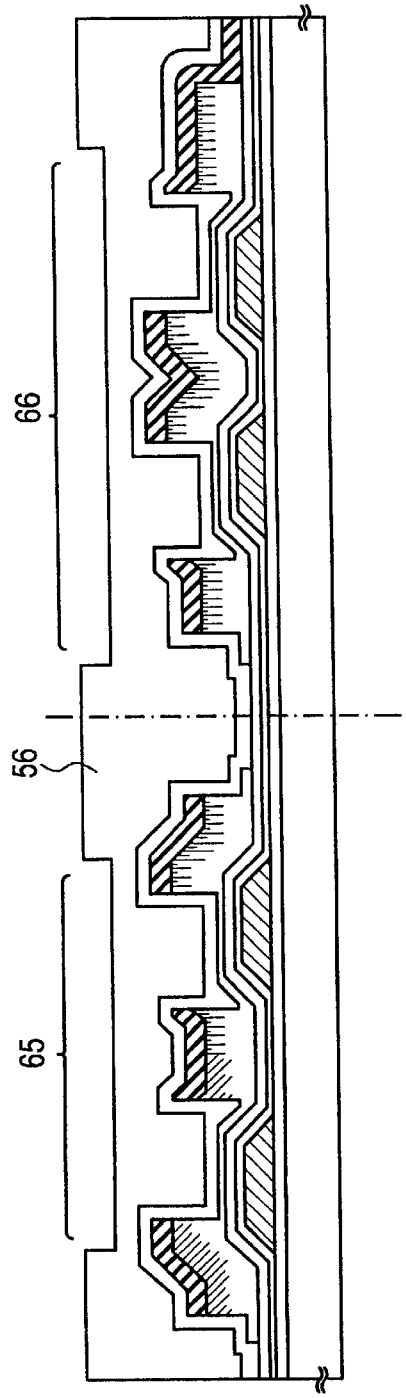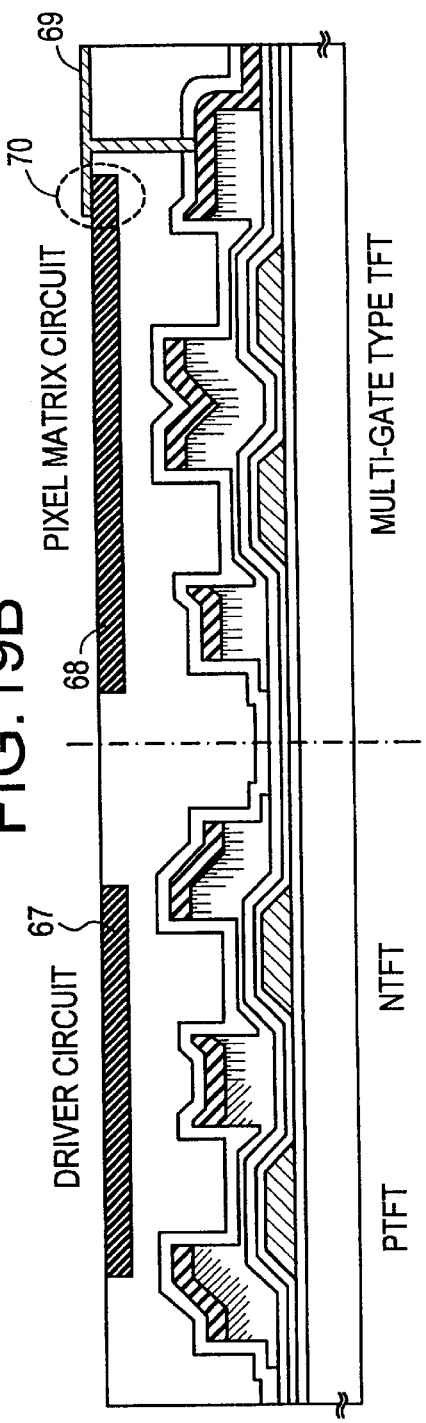

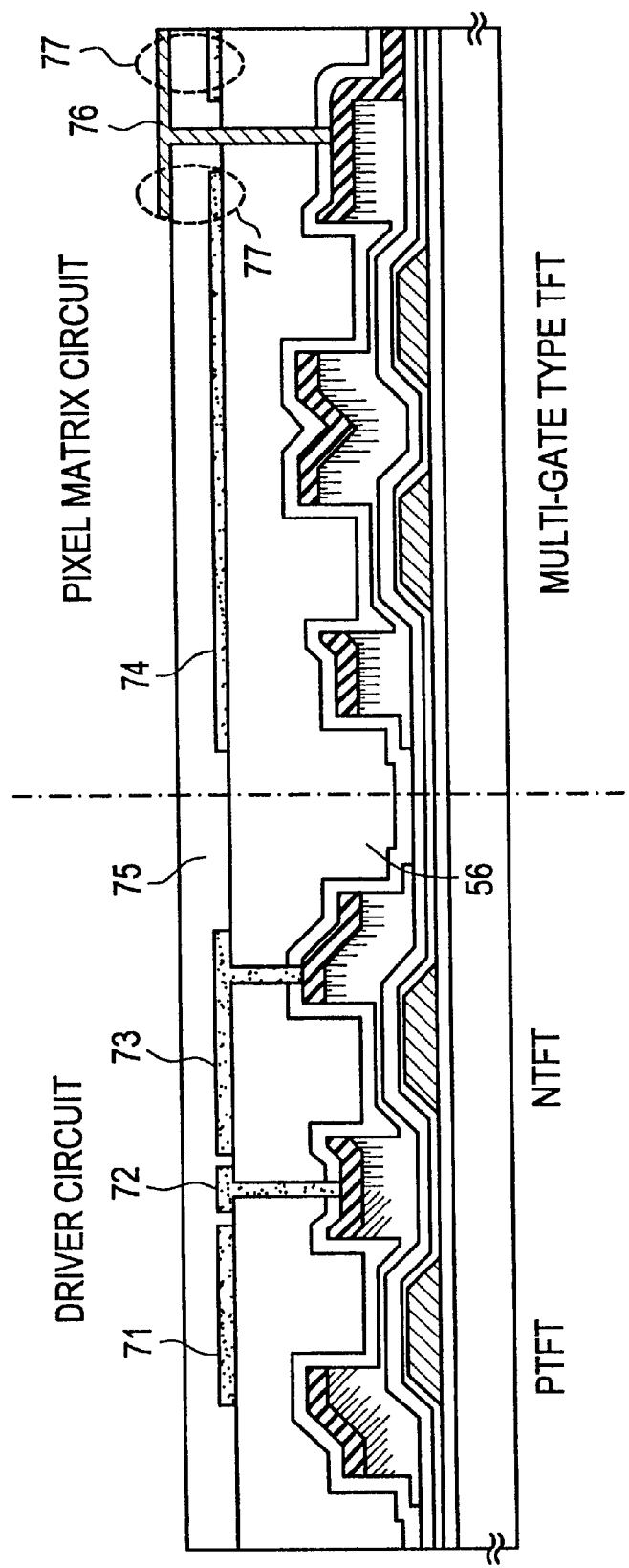

FPC ATTACHMENT PORTION

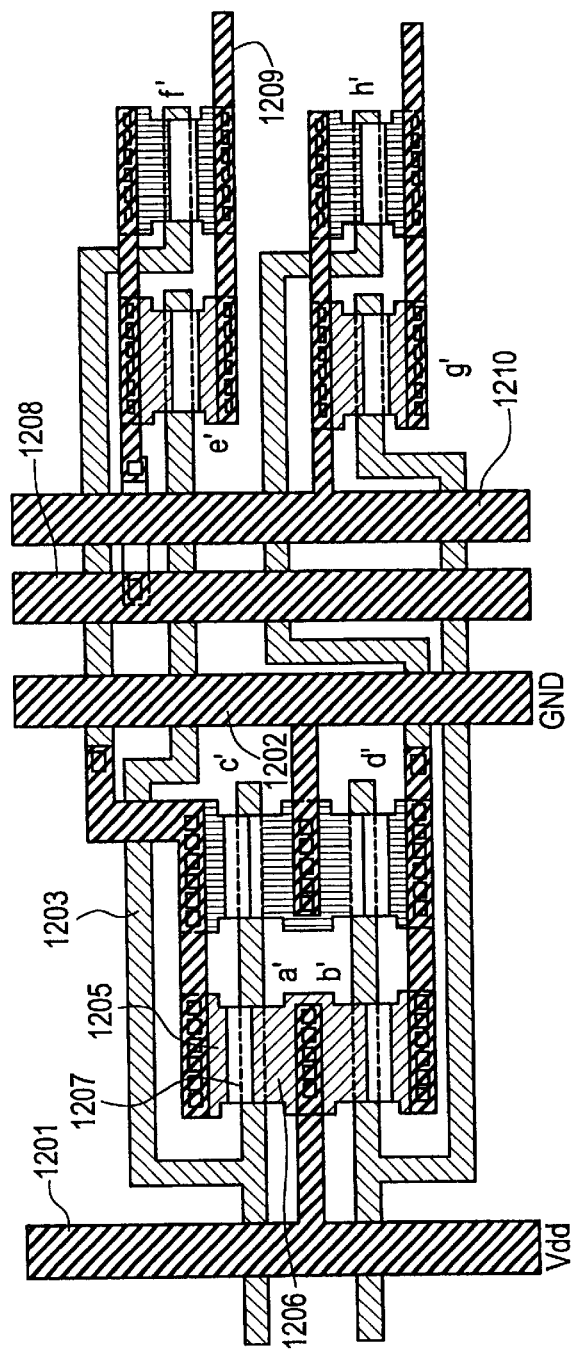
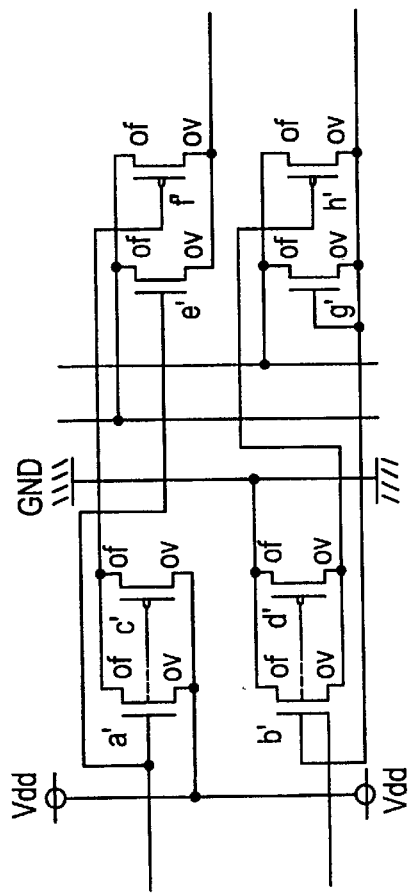
FIG.28A
FIG.28B

SEMICONDUCTOR DEVICE AND METHOD OF MANUFACTURING THE SAME

This application is a Divisional of application Ser. No. 09/157,939, filed Sep. 22, 1998 now U.S. Pat. No. 6,121,660.

BACKGROUND OF THE INVENTION

1. Field of the Invention

The present invention relates to a semiconductor device using a semiconductor thin film having a crystalline structure. Particularly, the present invention relates to a structure of an inverted stagger type thin film transistor (hereinafter abbreviated as a TFT). Moreover, the present invention relates to a structure of a semiconductor circuit, an electrooptical device, and an electronic equipment, each using the foregoing TFT.

Incidentally, in the present specification, the term "semiconductor device" indicates any device capable of functioning by using semiconductor characteristics. Any of TFTs, semiconductor circuits, electrooptical devices, and electronic equipments set forth in the present specification are contained in the category of the semiconductor device.

2. Description of the Related Art

Conventionally, a TFT is used as a switching element of an active matrix type liquid crystal display device (hereinafter abbreviated as AMLCD). At present, a market is occupied by products in which a circuit is constituted by TFTs each using an amorphous silicon film as an active layer. Particularly, as the structure of a TFT, an inverted stagger structure manufactured through simple steps is often adopted.

However, the performance of an AMLCD has been improved every year, and the operation performance (especially, operation speed) required for a TFT tends to become high. Thus, it becomes difficult to obtain an element having sufficient performance through the operation speed of a TFT using an amorphous silicon film.

Then a TFT using a polycrystalline silicon film (polysilicon film) instead of an amorphous silicon film has come into the limelight and the TFT having an active layer of the polycrystalline silicon film has been rapidly developed. At present, such TFTs have been partially made into products.

There are many publications as to the structure of an inverted stagger type TFT using a polycrystalline silicon film as an active layer. For example, there is a report "Fabrication of Low-Temperature Bottom-Gate Poly-Si TFTs on Large-Area Substrate by Linear-Beam Excimer Laser Crystallization and Ion Doping Method: H. Hayashi et al., IEDM95, pp829–832, 1995", the disclosure of which is herein incorporated by reference, and the like.

Although the above report explains a typical example (FIG. 4) of an inverted stagger structure using a polycrystalline silicon film, the reverse stagger structure (so-called channel stop type) of such a structure has various problems.

First, since the entire of an active layer is as very thin as about 50 nm, impact ionization occurs in a contact portion between a channel formation region and a drain region, so that deterioration phenomena such as hot carrier injection strikingly appear. Thus, it becomes necessary to form a large LDD region (Light Doped Drain region).

The control of the LDD region becomes the most important problem. In the LDD region, the control of the concentration of impurities and the length of the region are very delicate, and especially, the control of the length becomes a problem. At the present circumstances, although a system in which the length of the LDD region is regulated by a mask pattern is adopted, if the degree of fineness is progressed, a slight patterning error causes a large difference in TFT characteristics.

The dispersion of sheet resistance of the LDD region due to the dispersion of the film thickness of an active layer also becomes a serious problem. Moreover, the dispersion in taper angles and the like of a gate electrode also may cause the dispersion of effects of the LDD region.

Further, a patterning step is required to form the LDD region, which directly causes manufacturing steps to increase and throughput to lower. According to the reverse stagger structure set forth in the above-mentioned report, it is expected that at least six masks (until formation of source/drain electrodes) are required.

As described above, in the reverse stagger structure of the channel stop type, the LDD regions must be formed at both sides of a channel formation region in a plane in a lateral direction, so that it is very difficult to form the LDD regions with reproducibility.

SUMMARY OF THE INVENTION

An object of the present invention is to provide a technique for manufacturing a semiconductor device with high mass productivity, high reliability, and high reproducibility by very simple manufacturing steps.

According to an aspect of the present invention, a semiconductor device comprising a source region, a drain region, and a channel formation region, each being made of a semiconductor layer with crystal structure, wherein each of the source region and the drain region includes a lamination structure made of, toward a gate insulating film, at least a first conductive layer, a second conductive layer having higher resistance than the first conductive layer, and a semiconductor layer having the same conductivity as the channel formation region.

According to another aspect of the present invention, in the foregoing structure of the invention, a concentration profile of impurities contained in the first and second conductive layers is continuously changed from the first conductive layer to the second conductive layer.

According to still another aspect of the present invention, in the foregoing structure, the second conductive layer includes impurities with a concentration which continuously changes within a range of $5 \times 10^{17}$ to $1 \times 10^{19}$ atoms/cm$^3$.

According to still another aspect of the present invention, in the foregoing structure, two offset regions having different thicknesses exist between the channel formation region and the second conductive layer.

According to still another aspect of the present invention, in the foregoing structure, an offset region having a thickness larger than the channel formation region exists between the channel formation region and the second conductive layer.

According to still another aspect of the present invention, a semiconductor device comprises a gate electrode formed on a substrate having an insulating surface; a source region, a drain region, and a channel formation region, each being made of a semiconductor layer with crystal structure; and a source electrode and a drain electrode formed on the source region and the drain region, respectively, wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and the source electrode and/or drain electrode overlaps with the gate electrode at a portion over the channel formation region.

According to still another aspect of the present invention, a semiconductor device comprises a source region, a drain region, and a channel formation region, each being made of a semiconductor layer with crystal structure, wherein each of the source region and the drain region includes a lamination structure made of at least, toward a gate insulating film, a first conductive layer, a second conductive layer having higher resistance than the first conductive layer, and a semiconductor layer having the same conductivity as the channel formation region; and two offset regions having different film thicknesses and an HRD structure made of the second conductive layer exist between the channel formation region and the first conductive layer.

One of the two offset regions having different thicknesses is an offset in a film surface direction composed of a semiconductor layer having the same conductivity and the same thickness as the channel formation region, and the other is an offset in a thickness direction composed of a semiconductor layer having the same conductivity as the channel formation region and a film thickness larger than the channel formation region.

According to still another aspect of the present invention, a method of manufacturing a semiconductor device comprises the steps of forming a gate electrode, a gate insulating layer, and an amorphous semiconductor film over a substrate having an insulating surface; obtaining a semiconductor film with crystal structure by adding a catalytic element for promoting crystallization into the amorphous semiconductor film and by a heat treatment; adding impurities selected from only group 15 or groups 13 and 15 into the semiconductor having the crystal structure; gettering the catalytic element into a conductive layer containing the impurities by a heat treatment; forming a source electrode and a drain electrode on the conductive layer; and forming a channel formation region by etching the semiconductor film with the crystal structure by using the source electrode and the drain electrode as masks.

According to still another aspect of the present invention, a method of manufacturing a semiconductor device comprises the steps of forming a gate electrode, a gate insulating layer, and an amorphous semiconductor film over a substrate having an insulating surface; forming a semiconductor film with crystal structure by adding a catalytic element for promoting crystallization into the amorphous semiconductor film and by a heat treatment; adding impurities selected from only group 15 or groups 13 and 15 into the semiconductor film with the crystal structure; gettering the catalytic element into a conductive layer containing the impurities by a heat treatment; forming a source electrode and a drain electrode on the conductive layer; forming a channel formation region by etching the semiconductor film with the crystal structure by using the source electrode and the drain electrode as a mask; and adding an impurity for controlling a threshold voltage into only the channel formation region by using the source electrode and the drain electrode as masks.

According still another aspect of the present invention, a bottom gate type semiconductor device comprises a source region, a drain region, and a channel formation region, each being made of a semiconductor layer with crystal structure, wherein each of the source region and the drain region includes a lamination structure made of, toward a gate insulating film, at least a first conductive layer, a second conductive layer having higher resistance than the first conductive layer, and a semiconductor layer having the same conductivity as the channel formation region.

According to still another aspect of the present invention, a bottom gate type semiconductor device comprises a source region, a drain region, and a channel formation region, each being made of a semiconductor layer with crystal structure; wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and a concentration profile of impurities contained in the first and second conductive layers is continuously changed from the first conductive layer to the second conductive layer.

According to still another aspect of the present invention, a bottom gate type semiconductor device comprises a source region, a drain region, and a channel formation region, each being made of a semiconductor layer with crystal structure; wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and the second conductive layer includes impurities with a concentration which continuously changes within a range of $5 \times 10^{17}$ to $1 \times 10^{19}$ atoms/cm$^3$.

According to still another aspect of the present invention, a bottom gate type semiconductor device comprises a source region, a drain region, and a channel formation region, each being made of a semiconductor layer with crystal structure; wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and two offset regions having different thicknesses exist between the channel formation region and the second conductive layer.

According to still another aspect of the present invention, a bottom gate type semiconductor device comprises a source region, a drain region, and a channel formation region, each being made of a semiconductor layer with crystal structure; wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and an offset region having a thickness larger than the channel formation region exists between the channel formation region and the second conductive layer.

According to still another aspect of the present invention, a bottom gate type semiconductor device comprises a gate electrode formed over a substrate having an insulating surface; a source region, a drain region, and a channel formation region, each being made of a semiconductor layer with crystal structure; and a source electrode and a drain electrode formed on the source region and the drain region, respectively, wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and the source electrode and/or drain electrode overlaps with the gate electrode at a portion over the channel formation region.

According to still another aspect of the present invention, a bottom gate type semiconductor device comprises a source region, a drain region, and a channel formation region, each being made of a semiconductor layer with crystal structure; wherein each of the source region and the drain region includes a lamination structure made of, toward a gate insulating film, at least a first conductive layer, a second conductive layer having higher resistance than the first conductive layer, and a semiconductor layer having the same conductivity as the channel formation region; and two offset regions having different thicknesses and an HRD structure made of the second conductive layer exist between the channel formation region and the first conductive layer.

One of the two offset regions having different thicknesses is an offset in a film surface direction composed of a semiconductor layer having the same conductivity and the same thickness as the channel formation region, and the other is an offset in a thickness direction composed of a semiconductor layer having the same conductivity as the channel formation region and a film thickness larger than the channel formation region.

According to still another aspect of the present invention, a method of manufacturing a bottom gate type semiconductor device comprises the steps of forming a gate electrode, a gate insulating layer, and an amorphous semiconductor film over a substrate having an insulating surface; forming a semiconductor film with crystal structure by adding a catalytic element for promoting crystallization into the amorphous semiconductor film and by a heat treatment; adding impurities selected from only group 15 or groups 13 and 15 into the semiconductor film with the crystal structure; gettering the catalytic element into a conductive layer containing the impurities by a heat treatment; forming a source electrode and a drain electrode on the conductive layer; and forming a channel formation region by etching the semiconductor film with the crystal structure by using the source electrode and the drain electrode as a mask.

According to still another aspect of the present invention, a method of manufacturing a bottom gate type semiconductor device comprises the steps of: forming a gate electrode, a gate insulating layer, and an amorphous semiconductor film over a substrate having an insulating surface; forming a semiconductor film with crystal structure by adding a catalytic element for promoting crystallization into the amorphous semiconductor film and by a heat treatment; adding impurities selected from only group 15 or groups 13 and 15 into the semiconductor film with the crystal structure; gettering the catalytic element into a conductive layer containing the impurities by a heat treatment; forming a source electrode and a drain electrode on the conductive layer; forming a channel formation region by etching the semiconductor film with the crystal structure by using the source electrode and the drain electrode as a mask; and adding an impurity for controlling a threshold voltage into only the channel formation region by using the source electrode and the drain electrode as a mask.

BRIEF DESCRIPTION OF THE DRAWINGS

In the accompanying drawings:

FIGS. 12A to 12C are views showing manufacturing steps of a semiconductor circuit of Embodiment 13;

FIGS. 19A and 19B are views showing the structure of a pixel TFT of Embodiment 18;

FIG. 20 is a view showing the structure of a pixel TFT of Embodiment 19;

FIGS. 28A and 28B are views showing the pattern structure of a semiconductor circuit of Embodiment 26.

DETAILED DESCRIPTION OF THE PREFERRED EMBODIMENTS

Figure 1A:
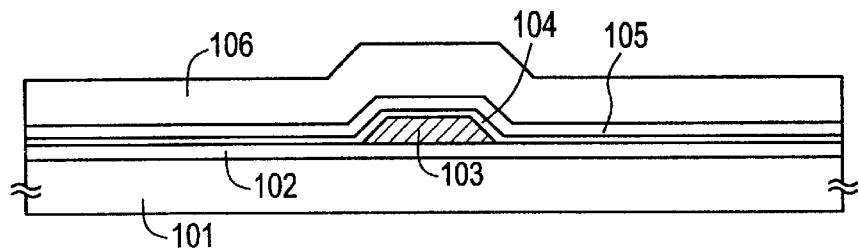
FIGS. 1A to 1E are views showing manufacturing steps of a thin film transistor of Embodiment 1.

Preferred embodiments of the present invention will now be described in detail with reference to the accompanying drawings.

[Embodiment 1]

A first embodiment of the present invention will be described with reference to FIGS. 1A–1E, 2A–2D, and 3. First, a method of manufacturing a semiconductor device of the present invention will be described with reference to FIGS. 1A to 1E.

An under film made of an insulating film containing silicon as the main ingredient is formed on a glass substrate (or quartz substrate, silicon substrate) 101. A gate electrode (first wiring) 103 made of a conductive film is formed thereon.

The line width of the gate electrode 103 is made 1 to 10 $\mu$m (typically 3 to 5 $\mu$m). The film thickness thereof is made 200 to 500 nm (typically 250 to 300 nm). In this embodiment, the gate electrode with a line width of 3 $\mu$m is formed by using a lamination film (for example, Ta/TaN) of a Ta (tantalum) film with a thickness of 250 nm and a TaN (tantalum nitride) film with a thickness of 250 nm.

For the gate electrode 103, a material (tantalum, tungsten, titanium, chromium, molybdenum, conductive silicon, etc.) having heat resistance against a temperature of at least 600° C. (preferably 800° C.) is used. The reason will be described later. Here, a first patterning step (gate electrode formation) is carried out.

Next, a silicon nitride film 104 (film thickness is 0 to 200 nm, typically 25 to 100 nm, preferably 50 nm), and a gate insulating layer 105 made of a silicon nitride oxide film expressed by $SiO_xN_y$ or silicon oxide film (film thickness is 150 to 800 nm, typically 200 to 500 nm, preferably 300 to 400 nm) are formed, and an amorphous semiconductor film 106 containing silicon as the main ingredient is formed thereon. In this embodiment, although an amorphous silicon film is exemplified, other compound semiconductor films (amorphous silicon film containing germanium, and the like) may be used.

Since the present invention relates to a channel etch type bottom gate structure, the thickness of the amorphous silicon film 106 is made sufficiently thick. The range of the thickness is made 100 to 600 nm (typically 200 to 300 nm, preferably 250 nm). In this embodiment, the thickness is made 200 nm. Although described later, it is necessary to suitably determine an optimum thickness, according as what offset region and LDD region are provided in a TFT of the present invention.

Although the amorphous silicon film 106 is formed by a low pressure CVD method in this embodiment, it is desirable to thoroughly manage the concentration of impurities such as carbon, oxygen and nitrogen at the film formation. If the concentration of these impurities is high, there is a fear that subsequent crystallization is blocked.

In this embodiment, management is made so that the concentration of each of carbon and nitrogen in the formed amorphous silicon³ film becomes less than $5\times10^{18}$ atoms/cm³ (typically $5\times10^{17}$ atoms/cm³ or less) and the concentration of oxygen becomes less than $1.5\times10^{19}$ atoms/cm³ (typically $1\times10^{18}$ atoms/cm³ or less). If such management is conducted, the concentration of impurities finally contained in a channel formation region of a TFT is fallen into the range.

Figure 1B:
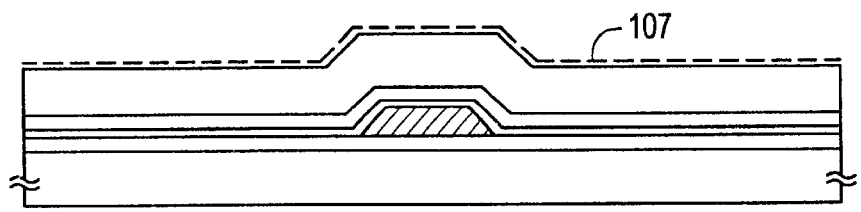

In this way, the state shown in FIG. 1A is obtained. Next, a solution containing a catalytic element (typically nickel) for promoting crystallization of silicon is applied by a spin coating method to form a Ni (nickel) containing layer 107 (FIG. 1B). The detailed conditions may be referred to the technique set forth in Japanese Patent Laid-Open No. Hei. 7-130652 (here, embodiment 1 in the publication) by the present inventors et al. The technique set forth in embodiment 2 of the publication may be used (FIG. 1B).

Although the publication discloses the means for applying a solution containing Ni, the following adding means may also be used.

(1) Direct addition by an ion implantation method or an ion doping method.

(2) Addition by a plasma treatment using an Ni electrode.

(3) Formation of an Ni film or a NixSiy (nickel silicide) film by a CVD method, a sputtering method, or an evaporation method.

As the catalytic element for promoting crystallization of silicon, germanium (Ge), cobalt (Co), platinum (Pt), palladium (Pd), iron (Fe), copper (Cu), gold (Au), lead (Pb), or the like may be used other than nickel.

Figure 1C:
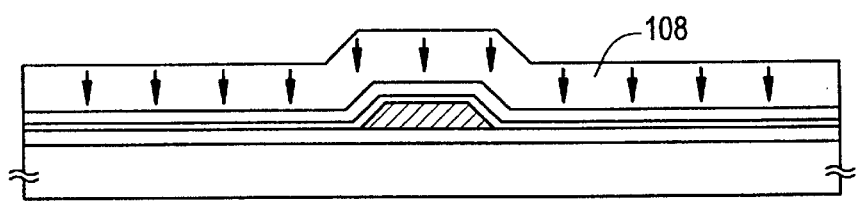

After the Ni containing layer 107 is formed, a heat treatment (dehydrogenating step) at about 450 to 500° C. for 2 hours is carried out, and then a heat treatment is carried out at 500 to 700° C. (typically 550 to 600° C.) for 2 to 12 hours (typically 4 to 8 hours) to obtain a semiconductor film 108 (in this embodiment, a crystalline silicon film (polysilicon film)) having a crystalline structure. In the case of the present invention, crystallization starts from the vicinity of the surface of the amorphous silicon film 106, and progresses roughly toward the direction of arrows (FIG. 1C).

Figure 1D:
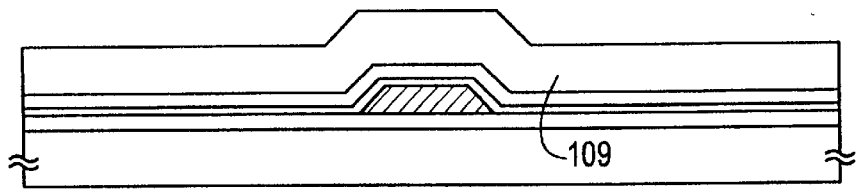

Next, irradiation of laser light or intense light having the strength comparable with the laser light is carried out to improve the crystallinity of the crystalline silicon film 108. In this step, lowering of defects in grains, lowering of unconformity grain boundaries, crystallization of amorphous components, and the like are carried out, so that a crystalline silicon film 109 having extremely excellent crystallinity is obtained (FIG. 1D).

Next, an element (typically phosphorus, arsenic, or antimony) selected from group 15 is added by an ion implantation method (with mass separation) or an ion doping method (without mass separation). In this embodiment, adjustment is made so that the concentration of phosphorus in the range of the depth of 30 to 100 nm (typically 30 to 50 nm) from the surface of the crystalline silicon film 109 is $1\times10^{19}$ to $3\times10^{21}$ atoms/cm³ (typically $1\times10^{20}$ to $1\times10^{21}$ atoms/cm³).

In this embodiment, a region 110 formed in this way and containing phosphorus with a high concentration is referred to as an n⁺ layer (or first conductive layer). The thickness of this layer is determined within the range of 30 to 100 nm (typically 30 to 50 nm). In this case, the n⁺ layer 110 subsequently functions as a part of source/drain electrodes. In this embodiment, the n⁺ layer with a thickness of 30 nm is formed.

Figure 1E:
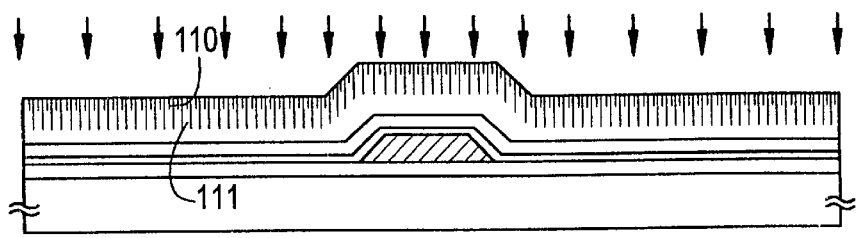

A region 111 formed under the n⁺ layer 110 and containing phosphorus with a low concentration is referred to as an n⁻ layer (or second conductive layer). In this case, the n⁻ layer comes to have resistance higher than the n⁺ layer and subsequently functions as an LDD region for relieving an electric filed. In this embodiment, the n⁻ layer with a thickness of 30 nm is formed (FIG. 1E).

At this time, the concentration profile in the depth direction at the addition of phosphorus is very important. This will be described with reference to FIG. 4. The concentration profile shown in FIG. 4 is an example in which phosphine ($PH_3$) is added by an ion doping method under the conditions that the acceleration voltage is 80 KeV and the RF power is 20 W.

Figure 4:
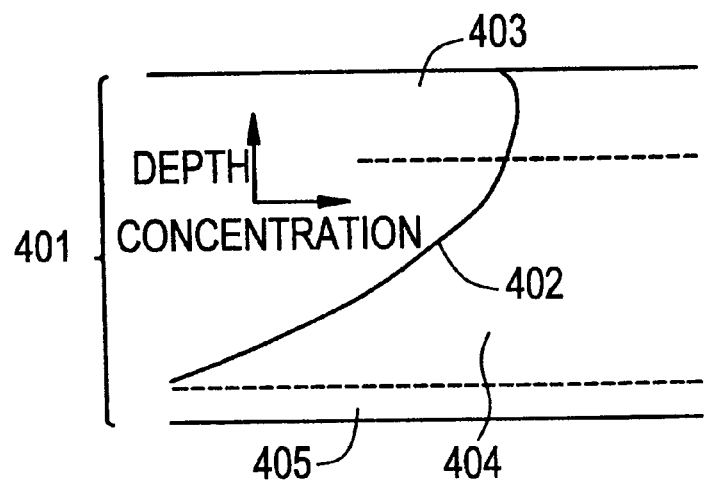
FIG. 4 is a view showing a concentration profile in a film of Embodiment 1.

In FIG. 4, reference numeral 401 denotes a crystalline silicon film, and 402 denotes a concentration profile of added phosphorus. This concentration profile is determined by set conditions such as an RF power, kind of an added ion, acceleration voltage, and the like.

At this time, the peak value of the concentration profile 402 is present in the inside of the n$^+$ layer 403 or in the vicinity of the interface, and as the depth in the crystalline silicon film 401 becomes deep (extends toward a gate insulating film), the concentration of phosphorus becomes low. At this time, since the concentration of phosphorus continuously changes over the entire region of the inside of the film, the n$^-$ layer 404 is inevitably formed under the n$^+$ layer 403.

Also in the inside of the n$^-$ layer 404, the concentration of phosphorus is continuously decreased. In this embodiment, a region in which the concentration of phosphorus exceeds $1 \times 10^{19}$ atoms/cm$^3$ is regarded as the n$^+$ layer 403, and the region in which the concentration is within the range of $5 \times 10^{17}$ to $1 \times 10^{19}$ atoms/cm$^3$ is regarded as the n$^-$ layer 404. However, since a definite boundary does not exist, the above values are merely criterions.

A region where the concentration of phosphorus is extremely lowered, and an under layer thereof become an intrinsic or substantially intrinsic region (i layer) 405. Incidentally, the intrinsic region is a region where impurities are not intentionally added. The substantially intrinsic region is a region where the impurity concentration (here, phosphorus concentration) is not larger than the spin density of the silicon film, or a region having an impurity concentration within the range of $1 \times 10^{14}$ to $1 \times 10^{17}$ atoms/cm$^3$ and indicating one conductivity.

Such an intrinsic or substantially intrinsic region is formed under the n$^-$ layer 404. However, the i layer 405 is substantially formed of a semiconductor layer with the same conductivity as the channel formation region. That is, when the channel formation region shows a weak n type or p type, the i layer shows the similar conductivity.

Like this, when the ion implantation method or ion doping method is formed for the formation of the n$^+$ layer, the n$^-$ layer can be formed under the n$^+$ layer. When the n$^+$ layer is provided by film formation as in a conventional case, such structure can not be realized. When the condition at the addition of ions is suitably set, it is possible to easily control the thickness of the n$^+$ layer and the n$^-$ layer.

Especially, since the thickness of the n$^-$ layer 111 subsequently becomes the thickness of the LDD region, very fine control is necessary. In the ion doping method or the like, since the concentration profile in the depth direction can be finely controlled by the setting of addition conditions, the thickness of the LDD region can be easily controlled. In the present invention, it is appropriate that the thickness of the n$^-$ layer 111 is adjusted within the range of 30 to 200 nm (typically 50 to 150 nm).

Figure 2A:
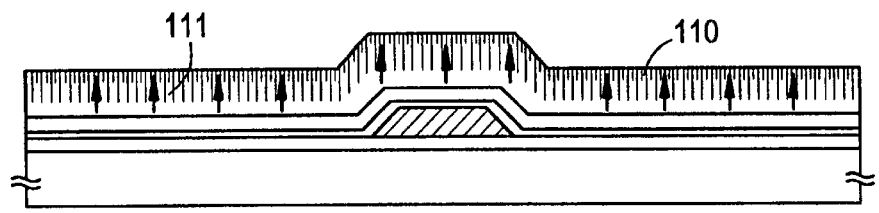
FIGS. 2A to 2D are views showing manufacturing steps of the thin film transistor of Embodiment 1.

Next, after the state shown in FIG. 1E is obtained, a heat treatment (furnace annealing) at a temperature of 500 to 700° C. (typically 600 to 650° C.) is carried out for 0.5 to 8 hours (typically 1 to 4 hours), and Ni in the i layer is moved to the n$^+$/n$^-$ layers. At this time, Ni is gettered substantially toward the direction of arrows (FIG. 2A).

As described above, this embodiment has a remarkable feature that phosphorus contained in the n$^+$ layer 110 and the n$^-$ layer 111 is used for gettering of Ni, and the n$^+$/n$^-$ layers are positively used as gettering regions. Although part of the n$^+$/n$^-$ layers where Ni was gettered remains as first and second conductive layers constituting source/drain regions, it becomes inactive nickel phosphide after gettering so that a problem does not occur.

In this case, since the distance where Ni must move is a distance corresponding to the film thickness of the crystalline silicon film, gettering is ended very quickly (in a short time). Thus, it is possible to realize (1) lowering of the concentration of added phosphorus, (2) lowering of a heat treatment temperature, and (3) shortening of a heat treatment time.

In this embodiment, since a TFT is manufactured on a glass substrate, the process highest temperature is determined by the heat resistance of glass. However, if a substrate having high heat resistance such as a quart substrate is used, the highest temperature of heat treatment for gettering can be raised up to 1000° C. (preferably 800° C.). If the temperature exceeds 800° C., reverse diffusion of phosphorus from the gettering region to the gettered region starts to occur, so that such a high temperature is not preferable.

Consideration to the gettering step is the reason why the gate electrode 103 is made to have heat resistance against a temperature of at least 600° C. (preferably 800° C.). Of course, in the case where the gettering step is not carried out by the furnace annealing but is carried out by lamp annealing or the like, the allowable range of the gate electrode is also widened.

When the catalytic element is gettered into the n$^+$/n$^-$ layers in this way, the concentration of Ni contained in the i layer is decreased down to $5 \times 10^{17}$ atoms/cm$^3$ or less. In the present circumstances, due to the detection limit of the SIMS (Secondary Ion Mass Spectroscopy), although it is only found that the concentration is not larger than $2 \times 10^{17}$ atoms/cm$^3$, it is expected that the concentration is decreased down to the spin density (about $1 \times 10^{14}$ atoms/cm$^3$) in the i layer or less.

Figure 2B:
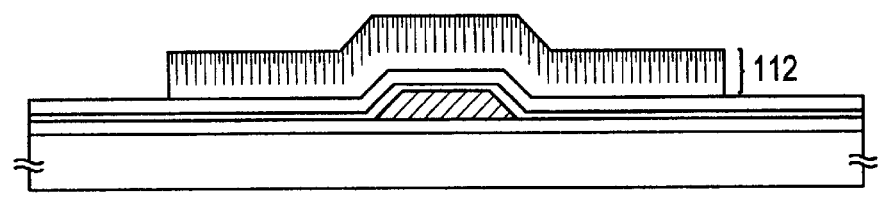

After the gettering step of the catalytic element is ended, patterning of the crystalline silicon film is carried out to form an island-like semiconductor layer 112. At this time, adjustment is made such that the length (channel width (W)) in the direction vertical to the moving direction of carriers when the TFT is finally completed, becomes 1 to 30 μm (typically 10 to 20 μm). Here, a second patterning step is carried out (FIG. 2B).

Here, although not shown in the drawing, part of the exposed gate insulating layer is etched to form a contact hole (region designated by 119 in FIG. 2D) for electrical connection between the gate electrode (first wiring) and a next formed electrode (second wiring). Here, a third patterning step is carried out.

Figure 2C:
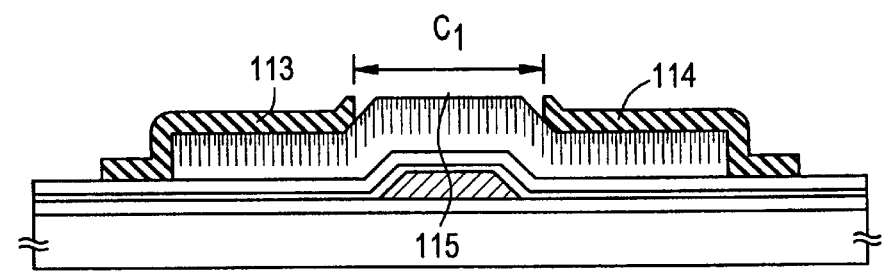

Next, a metallic film (not shown) having a conductivity is formed, and a source electrode 113 and a drain electrode 114 are formed by patterning. In this embodiment, a lamination film made of three-layer structure of Ti (50 nm)/Al (200 to 300 nm)/Ti (50 nm) is used. Moreover, as described above, wiring for electrical connection to the gate electrode is also concurrently formed. Here, a fourth patterning step is carried out (FIG. 2C).

Although described later, the length (denoted by $C_1$) of a region 115 (hereinafter referred to as channel etching region) placed over the gate electrode 103, that is, between the source electrode 113 and the drain electrode 114 subsequently determines the length of the channel formation region and the offset region. Although the length $C_1$ is selected within the range of 2 to 20 μm (typically 5 to 10 μm), in this embodiment, the length $C_1$ is made 4 μm.

Next, dry etching is carried out with the source electrode 113 and the drain electrode 114 as a mask to etch the island-like semiconductor layer 112 in a self-aligning manner. Thus, etching progresses in only the channel etching region 115 (FIG. 2D).

At this time, the n$^+$ layer 110 is completely etched, and etching is stopped in the form that only the intrinsic or substantially intrinsic region (i layer) is left. In the present invention, only the semiconductor layer with a thickness of 10 to 100 nm (typically 10 to 75 nm, preferably 15 to 45 nm) is left. In this embodiment, the semiconductor layer with a thickness of 30 nm is made to remain.

Figure 2D:
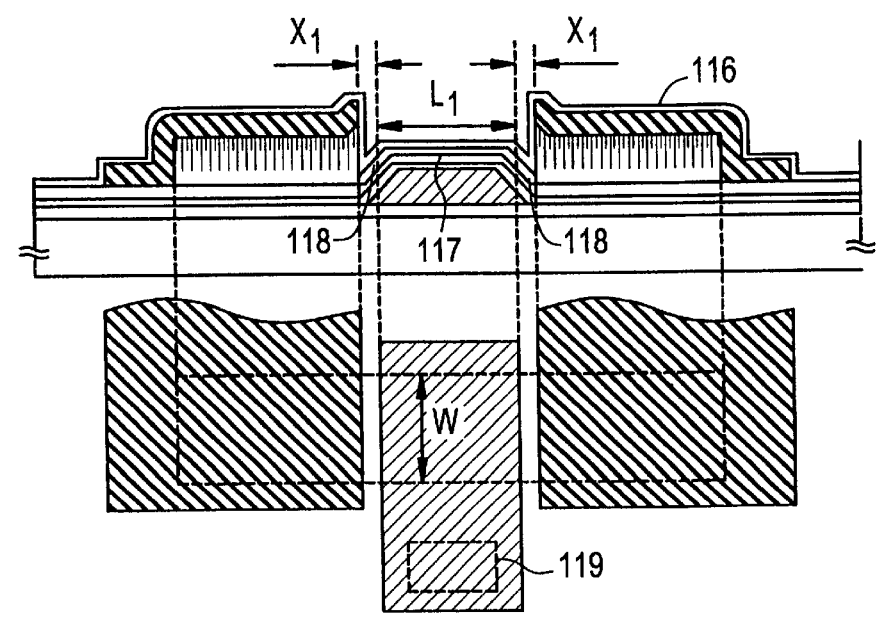

In this way, after etching (channel etching step) of the island-like semiconductor layer 112 is ended, a silicon oxide film or a silicon nitride film is formed as a protective film 116 to obtain an inverted stagger type TFT having the structure as shown in FIG. 2D.

In this state, in the channel etched island-like semiconductor layer 112, the region positioned just above the gate electrode 103 becomes a channel formation region 117. In the structure of this embodiment, the width of the gate electrode corresponds to the length of the channel formation region, and the length designated by $L_1$ in FIG. 2D is called channel length. An electric field from the gate electrode 103 is not applied to a region 118 positioned outside of the end of the gate electrode 103, and the region becomes an offset region. This length is designated by $X_1$.

In the case of this embodiment, the line width (corresponding to $L_1$) of the gate electrode 113 is 3 µm, and the length ($C_1$) of the channel etching region 115 is 4 µm, so that the length ($X_1$) of the offset region is 0.5 µm.

Figure 3:
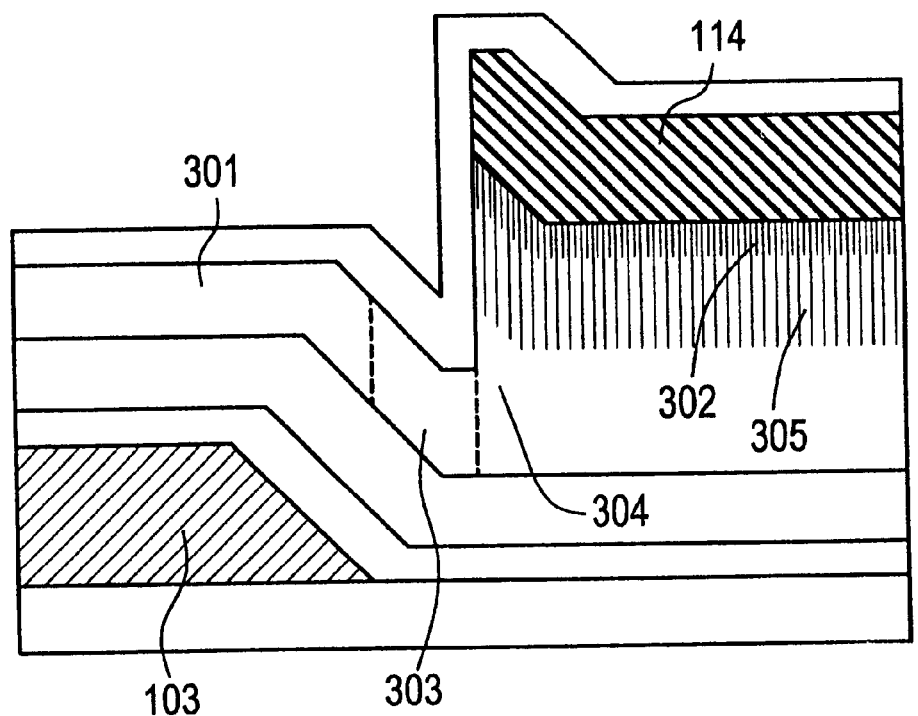
FIG. 3 is an enlarged view showing the structure of a thin film transistor of Embodiment 1.

FIG. 3 is an enlarged view of the drain region (semiconductor layer being in contact with the drain electrode 114). In FIG. 3, reference numeral 103 denotes a gate electrode, 301 denotes a channel formation region, 302 denotes an $n^+$ layer (source or drain electrode), 303 and 304 denote offset regions having different film thicknesses, and 305 denotes an $n^-$ layer (LDD region).

Although not explained here, a source region (semiconductor layer being in contact with the source electrode 113) has also a similar structure.

Although the structure shown in FIG. 3 is schematically shown, attention must be paid to the thickness relation of the respective regions. The most preferable structure in constructing the present invention is such that the thicknesses of the films satisfy the relation of $n^+$ layer 302<$n^-$ layer 305<offset region (i layer) 304.

This is because the $n^+$ layer 302 merely functions as an electrode, it is sufficient even if its thickness is small. On the other hand, an appropriate thickness is required for the $n^-$ layer 305 and the offset region 304 to effectively lessen an electric filed.

In the structure of this embodiment, two offset regions 303 and 304 having different film thicknesses, and the LDD region 305 exist in the place from the channel formation region 301 to the $n^+$ region 302. Reference numeral 303 denotes the offset region in the film surface direction formed by masking, which will be referred to as a mask offset region.

Reference numeral 304 denotes the offset region in the film thickness direction corresponding to the film thickness of the i layer, and will be referred to as a thickness offset region. It is appropriate that the thickness of the thickness offset region 304 is determined within the range of 100 to 300 nm (typically 150 to 200 nm). However, it is necessary to make the thickness greater than the channel formation region. If the thickness is smaller than the channel formation region, an excellent offset effect can not be desired.

The present inventors refer to such a structure made of offset+LDD as an HRD (High Resistance Drain) structure, and consider it to be distinguished from a normal LDD structure. In the case of this embodiment, the HRD structure is constituted by three stage structure of mask offset+ thickness offset+LDD.

At this time, since the LDD region 303 is controlled by the film thickness of the LDD region and the impurity concentration, the region has such advantages that reproducibility is extremely high, and the dispersion of characteristics is low. In an LDD region formed by patterning, as has been described in the section of the related art, the dispersion of characteristics due to a patterning error becomes a problem.

Since the length ($X_1$) of the mask offset region 303 is controlled by patterning, the length receives influence of errors due to patterning, shrinkage of glass, and the like. However, since the thickness offset region 304 and the LDD region 305 exist thereafter, the influence of the errors is lessened, and the dispersion of characteristics can be made small.

The length ($X_1$) of the mask offset is expressed by using the channel length ($L_1$) and the length ($C_1$) of the channel etching region as $(C_1-L_1)/2$. Thus, it is possible to set a desired offset length ($X_1$) by the patterning step at the formation of the source/drain electrodes. In the structure of this embodiment, the offset length ($X_1$) can be made 0.3 to 3 µm (typically 1 to 2 µm).

The inverted stagger type TFT having such a structure as shown in FIG. 2D can not be realized by a TFT using a conventional amorphous silicon film as an active layer (island-like semiconductor layer). This is because in the case where the amorphous silicon film is used, unless such a structure that the source/drain electrodes and the gate electrode overlap with each other is adopted, the mobility of carriers (electrons or holes) becomes extremely low.

Even if such a structure that the source/drain electrodes and the gate electrode overlap with each other is adopted, the mobility (field effect mobility) of a TFT using the amorphous silicon film is at most about 1 to 10 $cm^2/Vs$. On the other hand, if such a structure as in this embodiment is adopted, the mobility is too low to function as a switching element.

On the other hand, in the present invention, since a crystalline silicon film is used as an active layer, the carrier mobility is sufficiently high. That is, the structure of this embodiment can be realized by the very reason that the semiconductor film having crystal structure is used as the semiconductor layer.

Moreover, since the inverted stagger type TFT of this embodiment has the HRD structure, the TFT is very strong against deterioration phenomena such as hot carrier injection due to impact ionization and has high reliability. Further, the effect of the LDD region is dominant and the LDD region is formed with very excellent controllability, so that the dispersion of characteristics is very small.

Thus, the structure as in this embodiment is suitable for a TFT constituting a circuit which requires a high withstand voltage and does not require a high operation speed very much.

Moreover, as described in the manufacturing steps of this embodiment, only four masks are required for obtaining the inverted stagger type TFT having the structure shown in FIG. 2D. When considering that a conventional channel stop type TFT requires six masks, this means that the throughput and yield are remarkably improved.

As describe above, according to the structure of this embodiment, it is possible to manufacture a bottom gate type TFT having high reliability and reproducibility through the manufacturing steps with high mass productivity.

Incidentally, it is possible to realize a mobility of 30 to 250 $cm^2/Vs$ (typically 100 to 150 $cm^2/Vs$) and a threshold voltage of 0 to 3 V in the bottom gate type TFT (N-channel TFT) manufactured according to the manufacturing steps of this embodiment.

[Embodiment 2]

In this embodiment, in the structure of the present invention, an example of a structure different from the embodiment 1 will be described. Since the manufacturing steps of the TFT may follow the embodiment 1, only necessary portions will be described in this embodiment.

Figure 5A:
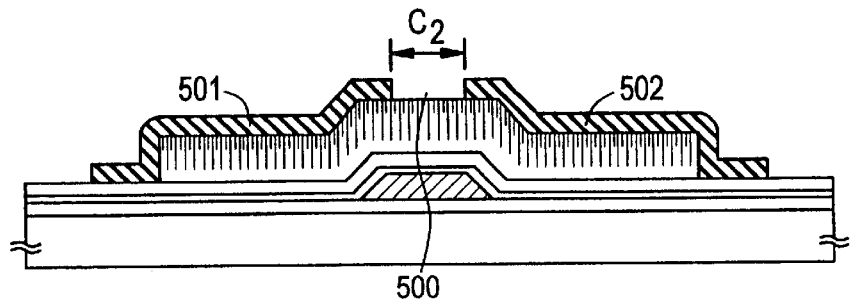
FIGS. 5A to 5C are views showing the structure of a thin film transistor of Embodiment 2.

First, in accordance with the manufacturing steps of the embodiment 1, the state shown in FIG. 5A is obtained. The point different from the embodiment 1 is that when a source electrode 501 and a drain electrode 502 are formed, the length of a channel etching region 500 is made $C_2$. At this time, the length $C_2$ is shorter than a gate electrode width and is determined within the range of 2 to 9 $\mu$m (typically 2 to 4 $\mu$m). That is, the feature of this embodiment is to provide electrodes such that the gate electrode and the source/drain electrodes overlap with each other.

Figure 5B:
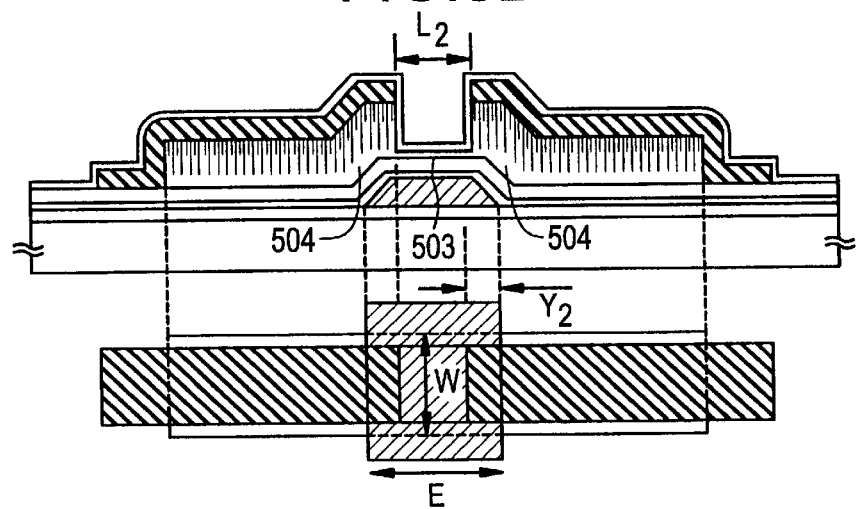

In this state, when a channel etching step is carried out as described in the embodiment 1 and a protective film is provided, the state shown in FIG. 5B is obtained. At this time, a region designated by 503 becomes a channel formation region, and its channel length is expressed by $L_2$ (=$C_2$). The length ($Y_2$) of a region (called a mask overlap region) 504 overlapped by mask design is expressed by (E–$L_2$)/2 when a gate electrode width is E.

Figure 5C:
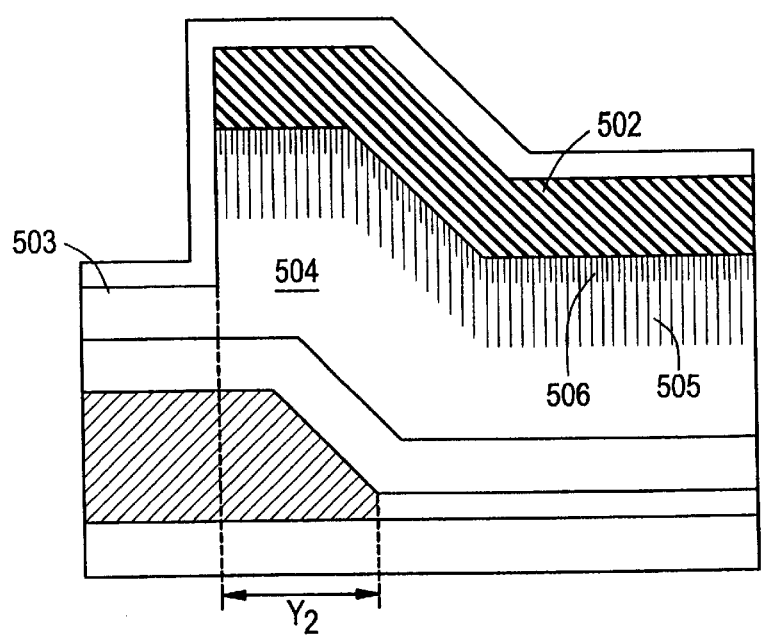

FIG. 5C is an enlarged view of a drain region, and carriers at the TFT operation reach an n$^+$ layer 506 (its thickness is 40 nm) and the drain electrode 502 through the channel formation region 503 (its thickness is 50 nm), the mask overlap region 504 (its thickness is 160 nm), and an LDD region 505 (its thickness is 50 nm).

In this case, although an electric field from the gate electrode is formed also in the mask overlap region 504, since the electric field of a region is weakened as the region is close to the LDD region 505, such a region has substantially the same function as the LDD region. Of course, when the region becomes closer to the LDD region 505, the electric field is not formed at all and the region can function also as an offset (thickness offset) region.

Like this, in the structure of this embodiment, the HRD structure is constituted by substantial LDD due to overlapping+thickness offset+LDD due to low concentration impurities. In the case where the film thickness of the overlap region 504 is small, it is also possible to form an LDD structure made of only substantial LDD due to overlapping+LDD due to low concentration impurities.

Also in the structure of this embodiment, since the overlap region 504 and the LDD region 505 are controlled by their respective thicknesses, the dispersion of characteristics is very small. Although the length ($Y_2$) of the overlapping region includes an error due to patterning or the like, since the LDD due to overlapping, the offset in the thickness direction, and the LDD due to low concentration impurities do not receive an influence of such an error, the dispersion of characteristics due to the error of $Y_2$ is lessened.

The structure as in this embodiment is suitable for a TFT constituting a circuit in which an offset component is small and a high operation speed is required.

In the structure of this embodiment, since minority carriers accumulated in the channel formation region by impact ionization are quickly drawn to the source electrode, this embodiment has a merit that it is hard to cause a substrate floating effect. Thus, it is possible to realize a TFT having a very high withstand voltage in addition to a high operation speed.

[Embodiment 3]

In this embodiment, in the structure of the present invention, an example of structure different from the embodiments 1 and 2 will be described. Since manufacturing steps of a TFT may basically follow the embodiment 1, only necessary portions will be described in this embodiment.

Figure 6A:
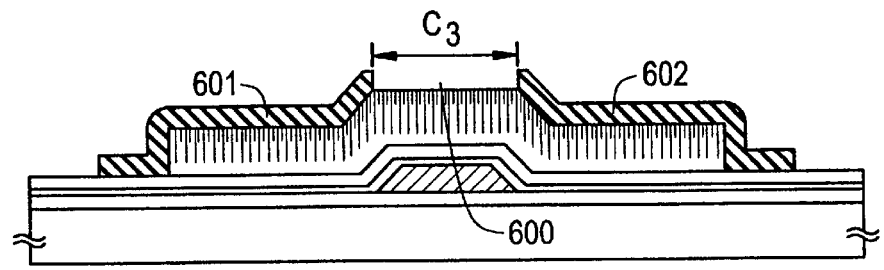
FIGS. 6A to 6C are views showing the structure of a thin film transistor of Embodiment 3.

First, in accordance with the manufacturing steps of the embodiment 1, the state shown in FIG. 6A is obtained. Here, the different point from the embodiment 1 is that the length of a channel etching region 600 is made $C_3$ when a source electrode 601 and a drain electrode 602 are formed. At this time, since the length $C_3$ is made to coincide with the width of a gate electrode, the length becomes 1 to 10 $\mu$m (typically 3 to 5 $\mu$m).

Figure 6B:
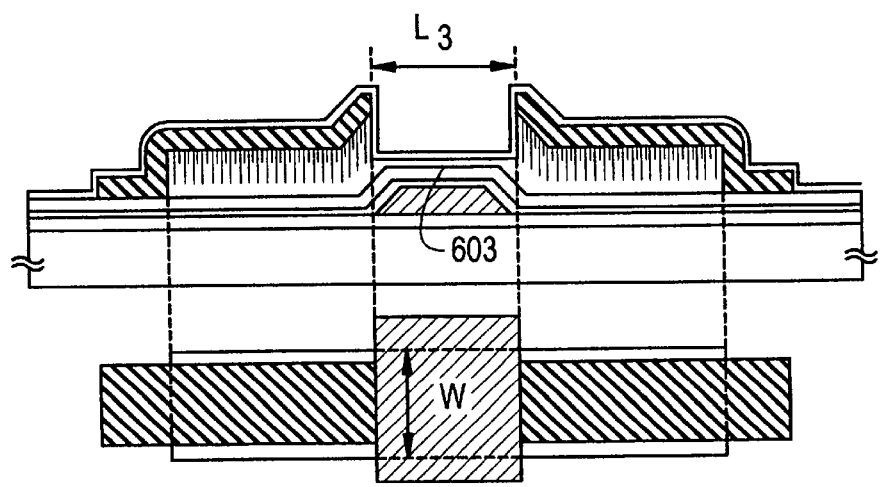

In this state, when a channel etching step is carried out as described in the embodiment 1 and a protective film is provided, the state shown in FIG. 6B is obtained. At this time, a region designated by 603 becomes a channel formation region, and its channel length is expressed by $L_3$ (=$C_3$).

Figure 6C:
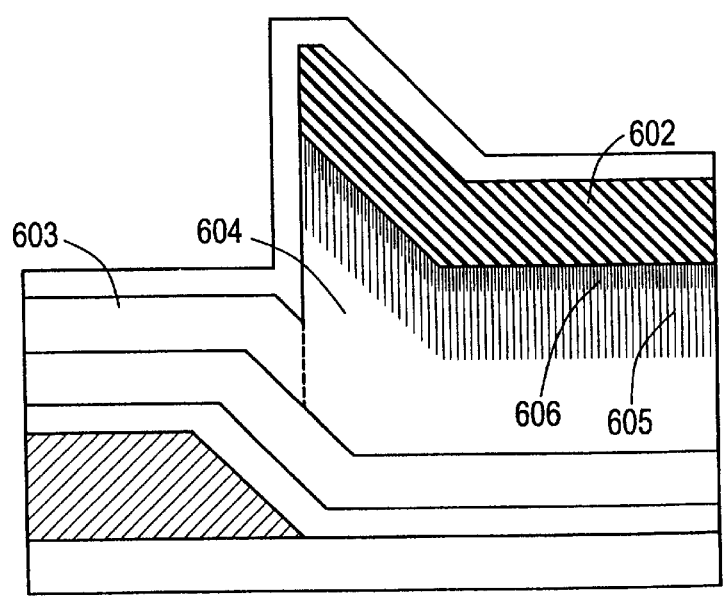

FIG. 6C is an enlarged view of a drain region, and carriers at the operation of the TFT reach an n$^+$ layer 606 (its thickness is 50 nm) and a drain electrode 602 through the channel formation region 603 (its thickness is 100 nm), a thickness offset region 604 (its thickness is 150 nm), and an LDD region 605 (its thickness is 100 nm). That is, in the structure of this embodiment, the HRD structure is constituted by two stage structure of thickness offset+LDD.

Also in the structure of this embodiment, since the thickness offset region 604 and the LDD region 605 are controlled by the respective film thicknesses, the dispersion of characteristics is very small. Further, sufficient withstand voltage characteristics can be obtained.

[Embodiment 4]

In this embodiment, in the structure of the present invention, an example of structure different from the embodiments 1, 2 and 3 will be described. Since manufacturing steps of a TFT may basically follow the embodiment 1, only necessary portions will be described in this embodiment.

Figure 7A:
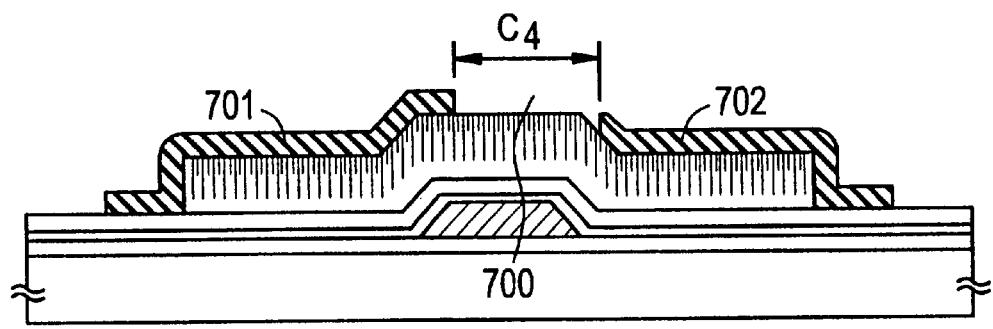
FIGS. 7A and 7B are views showing the structure of a thin film transistor of Embodiment 4.

First, in accordance with the manufacturing steps of the embodiment 1, the state shown in FIG. 7A is obtained. Here, the different point from the embodiment 1 is to make such a structure that one of a source electrode and a drain electrode is overlapped with a gate electrode when the source electrode and the drain electrode are formed, and the other is not overlapped.

In this embodiment, the length of a channel etching region 700 is made $C_4$. At this time, the length $C_4$ is selected within the range of 1 to 10 $\mu$m (typically 3 to 6 $\mu$m).

Figure 7B:
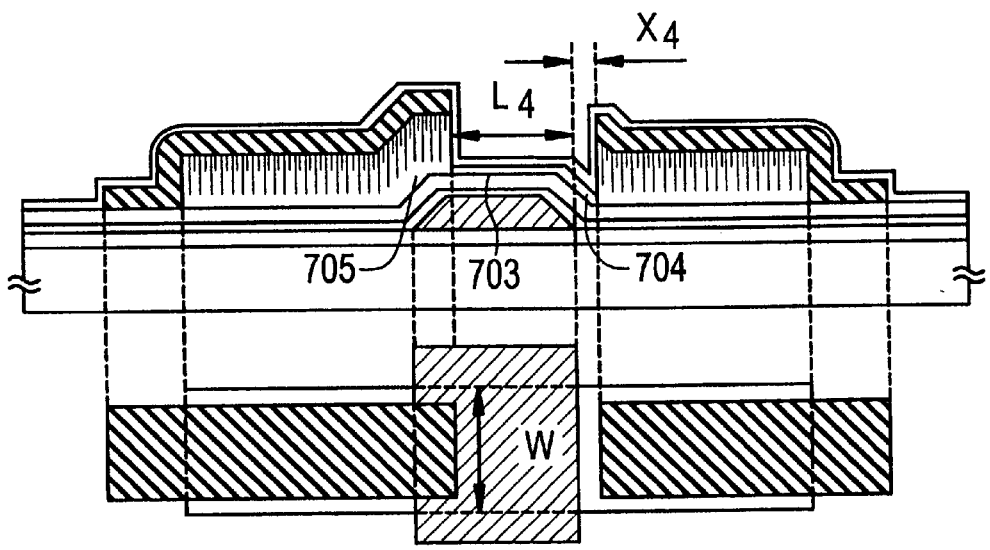

In this state, when a channel etching step is carried out as described in the embodiment 1 and a protective film is provided, the state shown in FIG. 7B is obtained. At this time, a region designated by 703 becomes a channel formation region, and its channel length is expressed by $L_4$ (=$C_4$–$X_4$).

Here, $X_4$ denotes the length of a mask offset region 704. The numerical range of the length $X_4$ may be referred to the embodiment 1. The numerical range of the length of an overlap region 705 may be set by referring to the embodiment 2.

This embodiment has a structure of combination of the HRD structure explained in the embodiment 1 and the HRD structure (or LDD structure) explained in the embodiment 2. Since a structural explanation has been made in the embodiments 1 and 2, the explanation here will be omitted.

In the case where the structure as in this embodiment is adopted, it is especially preferable to use the HRD structure (or LDD structure) shown in the embodiment 2 for a source region, and the HRD structure explained in the embodiment 1 for a drain region.

For example, especially in the channel end portion (connection portion) at the drain region side, electric filed concentration is high, so that the HRD structure having many resistance components as shown in the embodiment 1 is desirable. On the contrary, since such countermeasure for high withstand voltage is not necessary at the source side, the HRD (or LDD) structure having small resistance components as shown in the embodiment 2 is suitable.

Incidentally, in this embodiment, it is also possible to combine one of the source/drain region sides with the structure of the embodiment 2. Like this, it is appropriate that a user suitably selects the HRD structure or the LDD structure shown in the embodiments 1 to 3 for the source/drain regions and designs an optimum structure in view of circuit design. In this case, $3^2 = 9$ patterns of combination are possible.

[Embodiment 5]

In this embodiment, an example in which a CMOS circuit (inverter circuit) constituted by using a bottom gate type TFT having a structure shown in the embodiments 1 to 4 will be described with reference to FIG. 8. The CMOS circuit is constituted by complementarily combining an N-channel TFT (abbreviated as an NTFT) and a P-channel TFT (abbreviated by a PTFT).

Figure 8:
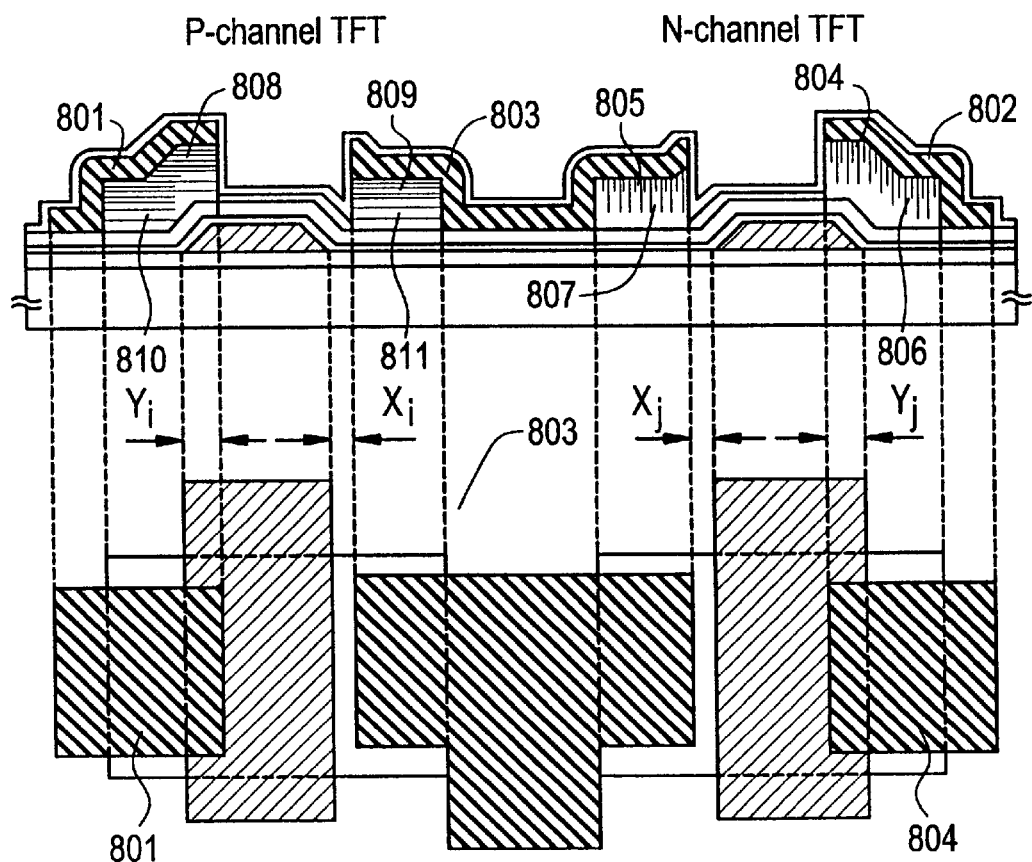
FIG. 8 is a view showing the structure of a CMOS circuit of Embodiment 5.

FIG. 8 shows a CMOS circuit using the structure shown in the embodiment 4, and reference numeral 801 denotes a source electrode of a PTFT, 802 denotes a source electrode of an NTFT, and 803 denotes a drain electrode common to the NTFT and the PTFT.

In the NTFT, $n^+$ layers 804 and 805, and $n^-$ layers 806 and 807 are formed through the manufacturing steps described in the embodiment 1. On the other hand, in the PTFT, $p^{++}$ layers 808 and 809, and $p^-$ layers 810 and 811 are formed.

Incidentally, it is very easy to manufacture a CMOS circuit on the same substrate. In the case of the present invention, first, the state of FIG. 2B is obtained in accordance with the steps of the embodiment 1.

In this state, although an element selected from group 15 has been added into the entire surface irrespective of an N type or a P type, in the case where the PTFT is manufactured, it is appropriate that the region to be made into the NTFT is concealed with a resist mask or the like and an element (typically boron, indium, or gallium) selected from group 13 is added.

Although boron is exemplified in this embodiment, at this time, the conductivity must be inverted by adding boron with a concentration (typically $3 \times 10^{19}$ to $1 \times 10^{22}$ atoms/cm$^3$, preferably $3 \times 10^{20}$ to $3 \times 10^{21}$ atoms/cm$^3$) at last 3 times the concentration of phosphorus. For the purpose of inverting all of the $n^+$ layer and $n^-$ layer into the $p^{++}$ layer and $p^-$ layer, it is important to adjust a concentration profile at the boron addition so that boron is added to a depth deeper than the added depth of phosphorus.

Figure 9:
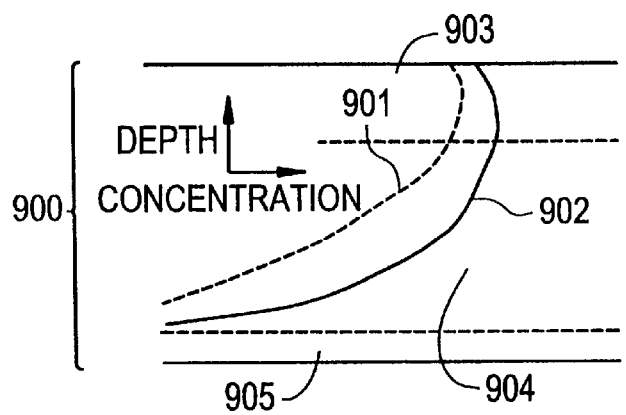
FIG. 9 is a view showing a concentration profile in a film of Embodiment 5.

Thus, the concentration profile of boron in a film becomes as shown in FIG. 9. In FIG. 9, 900 denotes a semiconductor layer, 901 denotes a concentration profile of phosphorus before addition of boron, 902 denotes a concentration profile of boron after addition of boron, 903 denotes a $p^{++}$ layer, 904 denotes a $p^-$ layer and 905 denotes an i layer.

At this time, the thickness of the $p^{++}$ layer 903 is made 10 to 150 nm (typically 50 to 100 nm), and the thickness of the $p^-$ layer 904 is made 30 to 300 nm (typically 100 to 200 nm). However, since the PTFT is originally strong against deterioration, it is not inevitably necessary to use the $p^-$ layer as an LDD region. The reason why the thickness of the $p^-$ layer is referred to is that as long as adding means such as an ion implantation method is used, a $p^-$ layer is inevitably formed by a continuously changed concentration gradient.

In this embodiment, in both the NTFF and the PTFT, the HRD structure (a type using an overlap region) shown in the embodiment 2 is used for the source region side, and the HRD structure (a type using mask offset) shown in the embodiment 1 is used for the drain region side.

Thus, as is clear from the top view, the source region side of the PTFT has an overlap region with a length of Yi and the drain region side has a mask offset region having a length of Xi. The source region side of the NTFT has an overlap region with a length of Yj and the drain region side has a mask offset region with a length of Xj.

At this time, the length of Xi and Xj, Yi and Yj can be freely adjusted according to mask design. Thus, it is satisfactory if the respective lengths are suitably determined according to necessity of circuit structure, and it is not necessary to make arrangement for the N-channel type and the P-channel type.

In such a structure, since the withstand voltage characteristics of the region which becomes a common drain of the CMOS circuit can be raised, the structure is very effective in the case where a circuit having a high operation voltage is constructed.

Although the structure of the CMOS circuit using the TFT with the structure shown in the embodiments 1 to 4 is shown in FIG. 8, it is needless to say that any combination other than this is possible. Since there are nine possible structure patterns for one TFT, there are $9^2 = 81$ patterns for the CMOS circuit. It is satisfactory if an optimum combination is adopted among these combinations according to performance required by a circuit.

As is described in this embodiment, the present invention can be easily applied to the PTFT as well. In this case, it is possible to realize such performance that the mobility of the bottom gate type TFT (PTFT) is 30 to 150 cm$^2$/Vs (typically 50 to 100 cm$^2$/Vs) and the threshold voltage is −1 to −3 V.

[Embodiment 6]

In this embodiment, an example in which Ge (germanium) as a catalytic element for promoting crystallization of silicon is used, will be described. In the case where Ge is used, in view of high compatibility, it is preferable to perform addition by an ion implantation method, an ion doping method, or a plasma treatment. It is also possible to perform addition from a vapor phase by carrying out a heat treatment in an atmosphere containing Ge.

Since Ge is an element in group 14 like Si (silicon), an affinity for Si is very good. It has been already described that a compound of Ge and Si (expressed by $Si_xGe_{1-x}$, where $0 < X < 1$) may be practically used for the semiconductor layer of the present invention.

Thus, in the case where crystallization of an amorphous silicon film using Ge is carried out like this embodiment, it is not necessary to getter the catalytic element after crystallization. Of course, although a gettering step may be carried out, the TFT characteristics are not influenced.

Thus, since the heat treatment of the gettering step can be omitted, the throughput of manufacturing steps is greatly improved. Since it is known that a TFT using a $Si_xGe_{1-x}$ film shows high mobility, if the content of Ge in the silicon film is suitable, it can also be expected that the operation speed is improved.

The structure of this embodiment can be applied to any structure of the embodiments 1 to 5.

[Embodiment 7]

In this embodiment, an example in which a contrivance for controlling a threshold voltage is applied to the TFT of the present invention will be described.

A technique for adding an element selected from group 13 (typically boron, indium, gallium) or group 15 (typically phosphorus, arsenic, antimony) into a channel formation region to control a threshold voltage is called channel doping.

It is effective to carry out the channel doping for the present invention, and two methods described below are simple and suitable.

First, there is a system in which a gas (for example, diborane, phosphine, etc.) containing an impurity for controlling a threshold voltage is mixed into a film forming gas at the point of time of forming an amorphous silicon film, so that a fixed amount of the impurity is made to contain at the same time as the film formation. In this case, although it is not necessary to increase the number of steps, since the same concentration of the impurity is added to both of the N type and P type TFTs, it is impossible to meet such a requirement that the concentration is made different between the two.

Next, there is a system in which after the channel etching step (forming step of a channel formation region) as described in FIG. 2D is ended, impurity addition is selectively carried out to the channel formation region (or channel formation region and mask offset region) with the source/drain electrodes as masks.

As the adding methods, although various methods such as an ion implantation method, an ion doping method, a plasma treatment method, a vapor phase method (diffusion from an atmosphere), and a solid phase method (diffusion from a film) may be used, since the channel formation region is thin, a method giving no damage, such as the vapor phase method and the solid phase method, is preferable.

In the case where the ion implantation method or the like is used, if the method is performed after a protective film covering the entire of the TFT is provided, damage to the channel formation region can be decreased.

After addition of impurities, a step of activating the impurities is carried out by laser annealing, lamp annealing, furnace annealing, or combination thereof. At this time, the damage to the channel formation region is almost repaired.

In the case where this embodiment is practiced, it is appropriate to add an impurity for controlling a threshold voltage with a concentration of $1\times10^{15}$ to $5\times10^{18}$ atoms/cm$^3$ (typically $1\times10^{15}$ to $5\times10^{17}$ atoms/cm$^3$) into the channel formation region.

In the case where this embodiment is practiced for the TFT of the present invention, the threshold voltage of an N-channel TFT can be restricted within the range of 0.5 to 2.5 V. When this embodiment is applied to a P-channel TFT, the threshold voltage can be restricted within the range of −0.1 to −2.0 V.

The structure of this embodiment may be combined with any structure of the embodiments 1 to 6. In the case where this embodiment is applied to the CMOS circuit of the embodiment 5, it is also possible to make the addition concentration or kinds of added impurities different between the N type TFT and the P type TFT.

[Embodiment 8]

In the structure shown in FIG. 2D, the source electrode 113 and the drain electrode 114 are formed so as to completely surround the island-like semiconductor layer. In this embodiment, a structure different from this will be described.

Figure 10A:
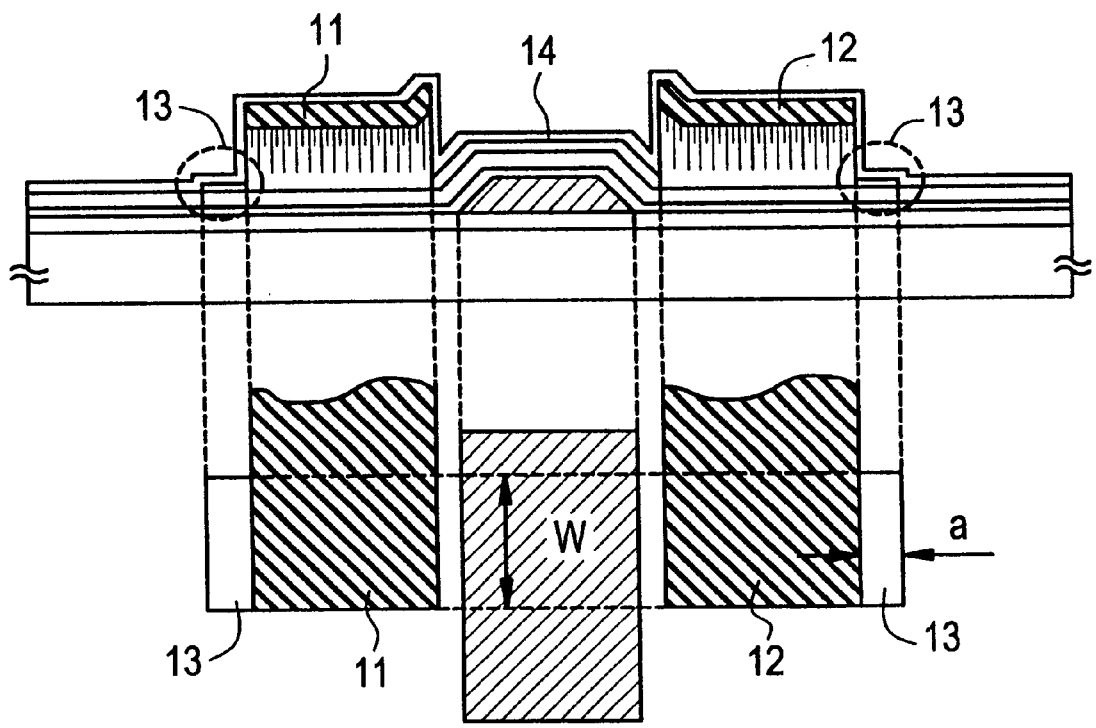
FIGS. 10A and 10B are views showing the structure of a thin film transistor of Embodiment 8.

Although the structure shown in FIG. 10A is basically similar to FIG. 2D, the feature is that the shape of a source electrode 11 and a drain electrode 12 are different. That is, in a portion, the source electrode 11 and the drain electrode 12 are formed inside of the island-like semiconductor layer (strictly speaking, source/drain regions) by a distance designated by "a".

A region denoted by reference numeral 13 is a region having the same film thickness as a channel formation region 14, and has a width of a distance "a". Although schematically shown in the drawing, the distance "a" is 1 to 30 μm (typically 10 to 200 μm).

Figure 10B:
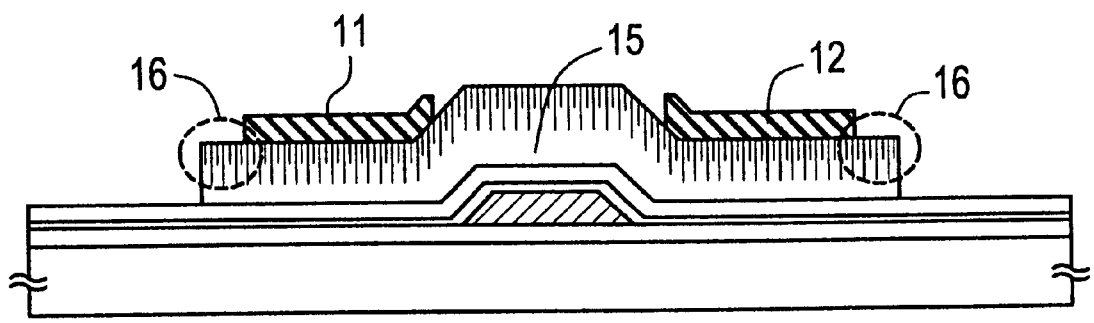

Here, the feature of this embodiment will be described in view of the manufacturing steps. As shown in FIG. 10B, in this embodiment, the source electrode 11 and the drain electrode 12 are formed. Here, reference numeral 15 denotes an island-like semiconductor layer, and an end 16 is exposed.

When a channel etching step is carried out in this state, the island-like semiconductor layer 15 is etched in a self-aligning manner with the source electrode 11 and the drain electrode 12 as masks. In this case, the end 16 is also etched at the same time.

In this way, the structure as shown in FIG. 10A is obtained. Thus, it is obvious that the end 16 has the same film thickness as the channel formation region 14.

There are following two reasons why the protrusion 13 of the island-like region is formed.

(1) The protrusion is used as an etching monitor in the channel etching step.

(2) Poor coverage due to a level difference of the island-like semiconductor layer is decreased when a protective film or an interlayer insulating film is formed in a subsequent step.

As the etching monitor, the protrusion is used for the case where an inspection is made by a sampling inspection in the manufacturing process as to whether the thickness of a channel formation region becomes suitable.

Incidentally, the structure of this embodiment can be combined with any structure of the embodiments 1 to 7.

[Embodiment 9]

In this embodiment, an example of a circuit structure of the CMOS circuit (inverter circuit) shown in the embodiment 5 will be described with reference to FIGS. 11A to 11C.

Figure 11A:
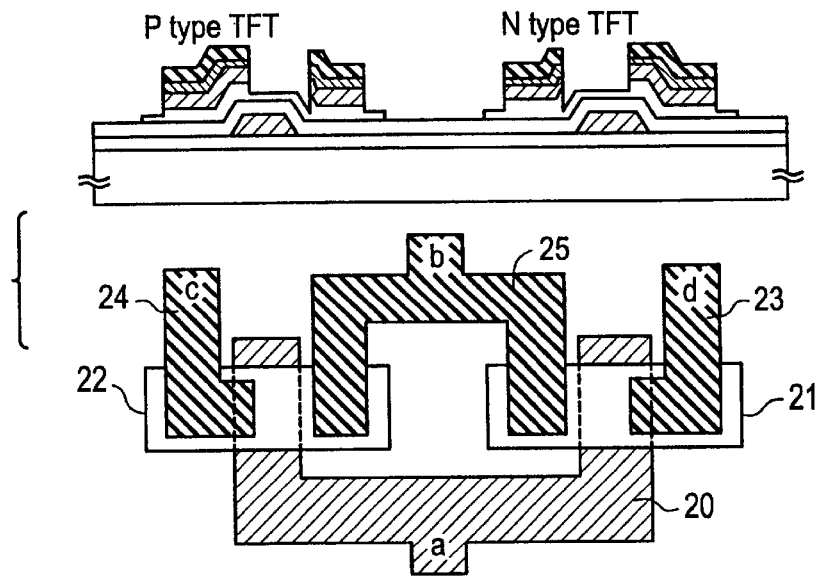
FIGS. 11A to 11C are views showing the structure of a CMOS structure of Embodiment 9.

FIG. 11A shows a CMOS circuit having the same structure as that shown in FIG. 8. In this case, the circuit structure is constituted by a gate electrode 20, a semiconductor layer 21 of an N type TFT, a semiconductor layer 22 of a P type TFT, a source electrode 23 of the N type TFT, a source electrode 24 of the P type TFT, and a common drain electrode 25.

Figure 11B:
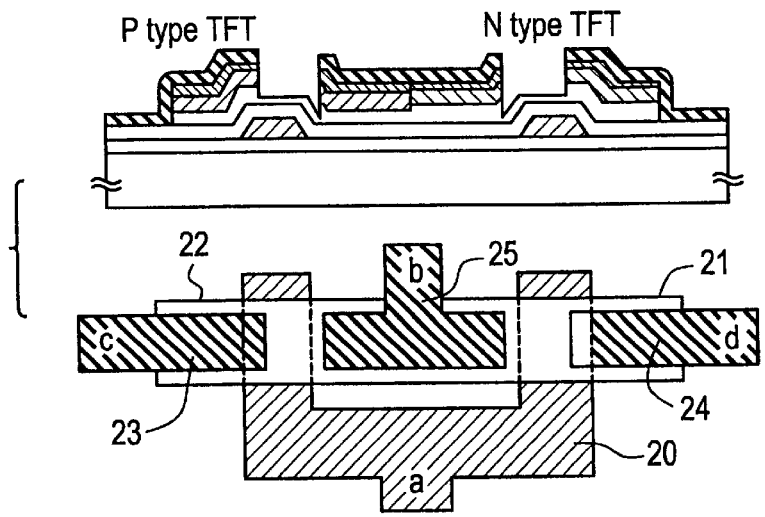
Figure 11C:
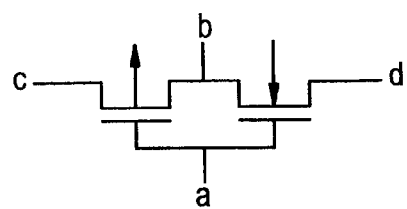

Individual end portions "a", "b", "c", and "d" correspond to the end portions "a", "b", "c", and "d" of the inverter circuit shown in FIG. 11C.

Next, FIG. 11B shows an example in which a semiconductor layer which becomes a drain region is made common to the N type TFT and the P type TFT. The respective reference numerals correspond to those explained in FIG. 11A.

According to the structure of FIG. 11B, since TFTs can be formed with a very high density, the structure is very effective for the case where a circuit is highly integrated. Although the common semiconductor layer forms a PN junction, it does not become a problem.

[Embodiment 10]

In this embodiment, in the process of manufacturing a TFT and a CMOS circuit having the structure of the embodiments 1 to 5, an example in which lamp annealing is used as a means for heat treatment will be described.

As the lamp annealing, a heat treatment by RTA (Rapid Thermal Anneal) is known. This is a technique for carrying out a high temperature heat treatment in a short time (several seconds to several tens seconds) by irradiation of intense light from an infrared lamp, and its throughput is very excellent. Other than the infrared light, there is also a case where ultraviolet light is supplementarily used.

In the present invention, a heat treatment is carried out for a crystallization step of an amorphous semiconductor film, a step of improving crystallinity of a crystalline semiconductor film, a gettering step of a catalytic element, an activating step of an impurity for controlling a threshold value, or the like. At such a time, this embodiment can be used.

It is possible to freely combine the structure of this embodiment with the structure of other embodiment.

[Embodiment 11]

In this embodiment, a case where gettering of a catalytic element is carried out by a means different from the embodiment 1 will be described.

In the embodiment 1, although the gettering step is carried out by using only elements selected from group 15, the gettering step of a catalytic element can also be carried out in the state where elements selected from group 13 and group 15 are added.

In this case, first, after the state shown in FIG. 1E is obtained, only a region which becomes an N-channel TFT is concealed with a resist mask, and then, boron is added. That is, only phosphorus exists in the region which becomes the N-channel TFT, and phosphorus and boron exists in the region which becomes a P-channel TFT.

It is appropriate that a heat treatment is carried out in this state so that the gettering step of the catalytic element is performed. According to experiments performed by the present inventors, it is ascertained that a gettering effect by phosphorus+boron is higher than a gettering effect by only phosphorus. However, a gettering effect is not obtained by only boron, and a high gettering effect was obtained by the combination of (phosphorus)+(boron with a high concentration than phosphorus).

It is possible to freely combine the structure of this embodiment with the structure of other embodiments.

[Embodiment 12]

In the case where a quartz substrate or a silicon substrate having high heat resistance is used as a substrate, it is also effective to carry out a heat treatment in an oxidizing atmosphere containing a halogen element at 700 to 1100° C. before the formation of an n$^+$ conductive layer and an n conductive layer. This is a technique of using a gettering effect for a metal element by the halogen element.

By using both this technique and the gettering step as described in the embodiment 11, it is possible to more thoroughly remove the catalytic element used for crystallization of the amorphous semiconductor film. In this way, if the catalytic element is thoroughly removed from at least a channel formation region, a semiconductor device having high reliability can be obtained.

[Embodiment 13]

In this embodiment, description will be made to an example of manufacturing an active matrix type display device in which in accordance with the basic manufacturing steps described in the embodiment 1, a driver circuit (peripheral driving circuit) and a pixel matrix circuit are integrally formed on the same substrate.

In this embodiment, a CMOS circuit (a type shown in FIG. 11B) of a basic structure will be shown as a driver circuit. Other than the driver circuit, it is also possible to constitute a D/A converter circuit, a memory circuit, a signal processing circuit such as a γ correction circuit (this will be referred to as a logic circuit to distinguish it from a driver circuit) by TFTs of the present invention. Also in this case, the CMOS circuit is used as a basic circuit.

As the pixel matrix circuit, an example in which a multi-gate type TFT is used will be described. Although the example of double gate structure is shown in this embodiment, it does not matter if a single gate structure or a triple gate structure is used.

First, by using the manufacturing steps of the embodiment 1, a process up to the step (gettering step) shown in FIG. 2A is ended. This state is shown in FIG. 12A.

In FIG. 12A, reference numeral 30 denotes a glass substrate, 31 denotes an under film, 32 denotes a gate electrode of a PTFT constituting the CMOS circuit, and 33 denotes a gate electrode of an NTFF. Reference numerals 34 and 35 are gate electrodes of a pixel TFT, and both the electrodes are connected to each other at a not-shown portion. In this embodiment, as a material of the gate electrode, a lamination film made of tantalum (Ta) and tantalum nitride (TaN) is used. According to circumstances, an anodic oxidation film expressed by $Ta_2O_5$ may be provided on the surface of the gate electrode. The gate electrode may be formed of only a tantalum film.

A silicon nitride film 36 and a silicon nitride oxide film 37 are provided thereon, and a semiconductor layer is provided further thereon. The semiconductor layer of this embodiment is crystallized by a means as shown in the embodiment 1, and thereafter, a phosphorus addition step is carried out to form an n$^+$ layer 38, an n$^-$ layer 39, and an i layer 40. The detailed conditions of the respective layers are described in the embodiment 1.

Next, a gettering step by the RTA process is carried out, and the catalytic element (nickel according to the embodiment 1) contained in the i layer 40 is gettered into a region containing phosphorus.

Next, a portion other than a region which becomes the PTFT of the CMOS circuit is concealed with a resist mask (not shown), and boron as an element selected from group 13 is added. In this embodiment, boron with a concentration three times the concentration of previously added phosphorus is added to form a p$^{++}$ layer 41 and a p$^-$ layer 42 (FIG. 12B).

Next, a laser annealing step is carried out to improve crystallinity of a crystalline semiconductor layer which is made amorphous by the ion implantation step (or ion doping step). At the same time, activation of an added impurity is also carried out (FIG. 12C).

If dehydrogenating by the RTA process is carried out before this laser annealing step, it is possible to prevent a bumping phenomenon of hydrogen at the laser annealing.

Next, the crystalline semiconductor layer is etched to form island-like semiconductor layers 43 and 44. At this time, a contact hole is formed to connect a next formed electrode (second wiring) to part of the gate wiring.

The foregoing laser annealing step may be carried out after the crystalline semiconductor layer is processed into an island-like semiconductor layer.

Then a thin film having conductivity is formed and is patterned to form a source electrode 45 (PTFT), a source electrode 46 (NTFT), and common drain electrode 47. Moreover, a source electrode 48 and a drain electrode 49 of the pixel TFT are formed. Incidentally, since an electrode 50 functions as only a mask, the electrode will be referred to as a mask electrode in the present specification (FIG. 13A).

Figure 13A:
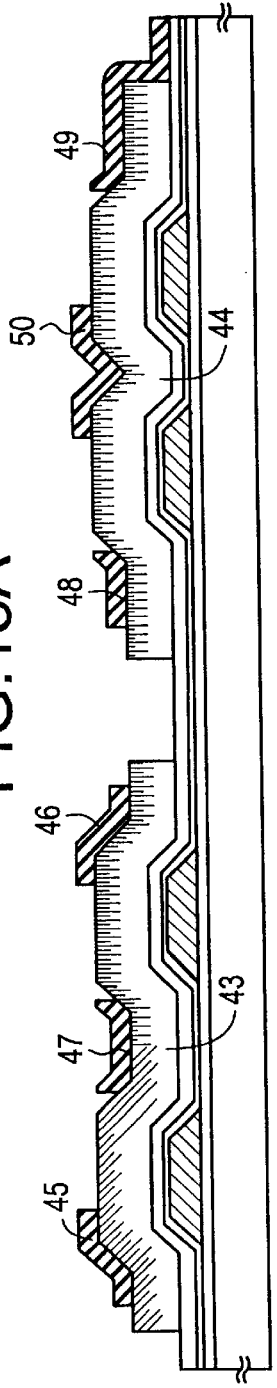
FIGS. 13A to 13C are views showing manufacturing steps of the semiconductor circuit of Embodiment 13.

After the state shown in FIG. 13A is obtained, a channel etching step is carried out to form channel formation regions 51 to 54. At this time, in the driver circuit, a mask offset region is provided at only a drain side of the respective TFTs, and an overlap region is provided at both source sides.

Figure 13B:
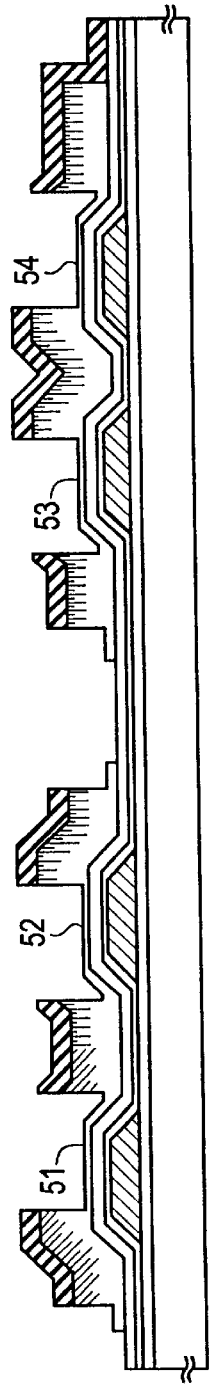

With respect to the pixel TFT, as shown in FIG. 13B, a mask offset region is provided at the sides which are connected to the source electrode 48 and the drain electrode 49, and an overlap region is provided under the mask electrode 50.

In the pixel TFT, since the source/drain regions are exchanged to each other at the charging and discharging of image signals, it is necessary to raise the withstand voltage of both ends of the TFT. If a resistance component under the mask electrode 50 is high, a switching operation becomes slow, so that it is desirable to make the state where carries are easily moved by providing the overlap region.

This embodiment is one example of the best mode, and this embodiment is not limited to this structure. An operator may select an optimum structure in view of merits of the respective structures explained in the embodiments 1 to 4.

Next, a protective film 55 made of a silicon nitride oxide film and having a thickness of 200 nm is formed, and an interlayer insulating film 56 made of an organic resin film is formed thereon. As the organic resin film 56, polyimide, polyamide, polyimide amide, or acryl may be used.

Figure 13C:
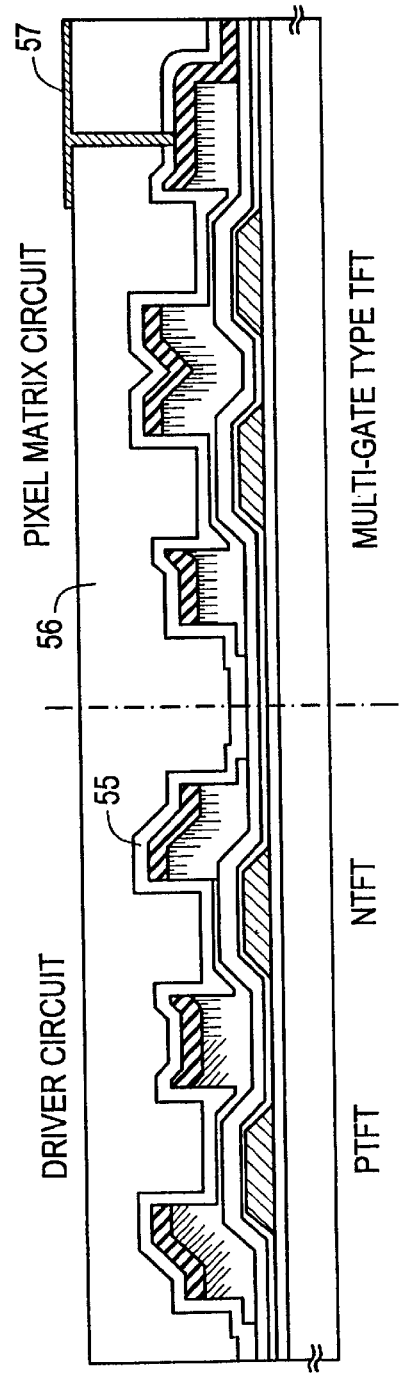

Next, a contact hole is formed in the interlayer insulating film 56, and a pixel electrode 57 made of a transparent conductive film (typically indium tin oxide, (ITO)) is formed. Finally, hydrogenating is carried out so that an active matrix substrate as shown in FIG. 13C is completed.

Subsequently, when a liquid crystal layer is held between an opposite substrate and the active matrix substrate by using a well known cell assembling step, it is possible to manufacture an active matrix type liquid crystal display device.

The number of patterning steps necessary for manufacturing the active matrix substrate shown in this embodiment is seven. The steps are as follows:

(1) gate electrode patterning, (2) boron added region patterning, (3) island-like semiconductor layer patterning, (4) gate contact patterning, (5) source/drain electrode patterning, (6) ITO contact patterning, and (7) ITO patterning.

As described above, since the active matrix substrate can be manufactured with a very few number of masks, the throughput is greatly improved. At the same time, since circuit design can be freely made by using the TFTs having the structure shown in the embodiments 1 to 5, it is possible to easily realize a display device having high reliability and high reproducibility.

Figure 14A:
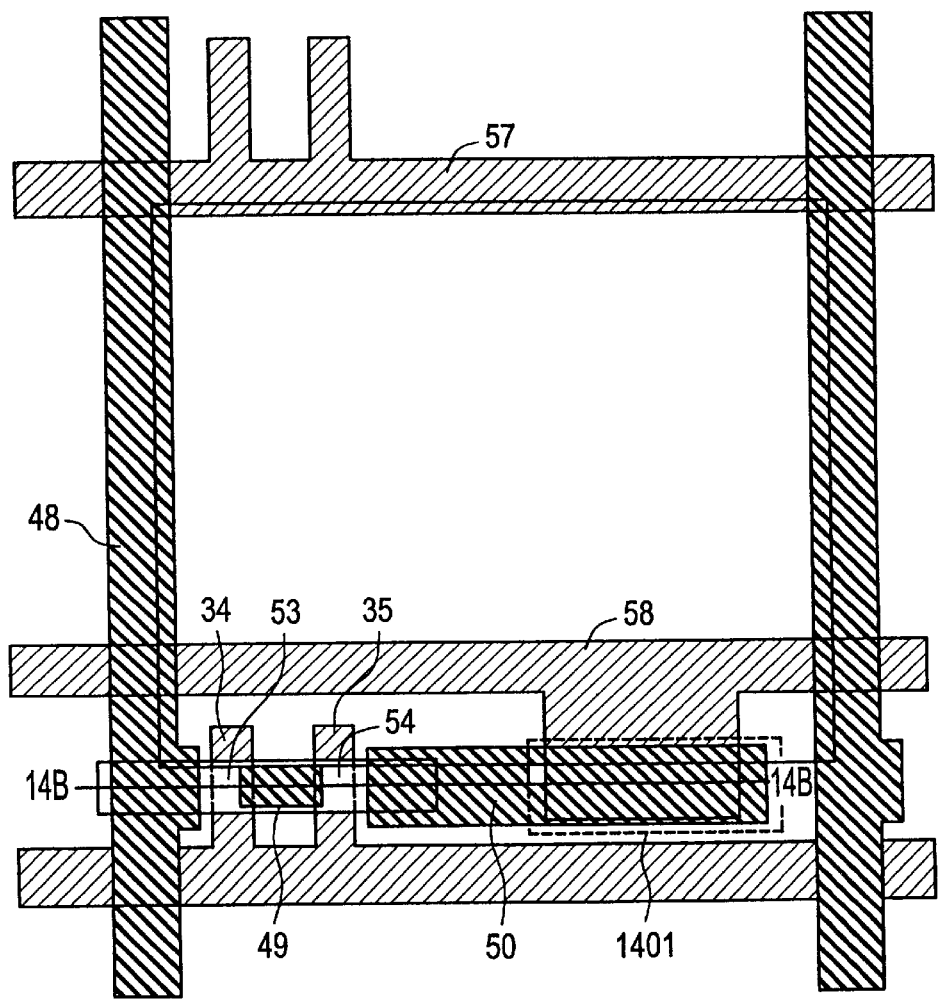
FIGS. 14A and 14B are views showing the structure of a pixel matrix circuit of Embodiment 13.

FIG. 14A is a top view of part of the pixel matrix circuit of this embodiment seen from the above. In FIG. 14A, the same reference numerals as those used in this embodiment are basically used. Thus, only necessary portions will be described.

Figure 14B:
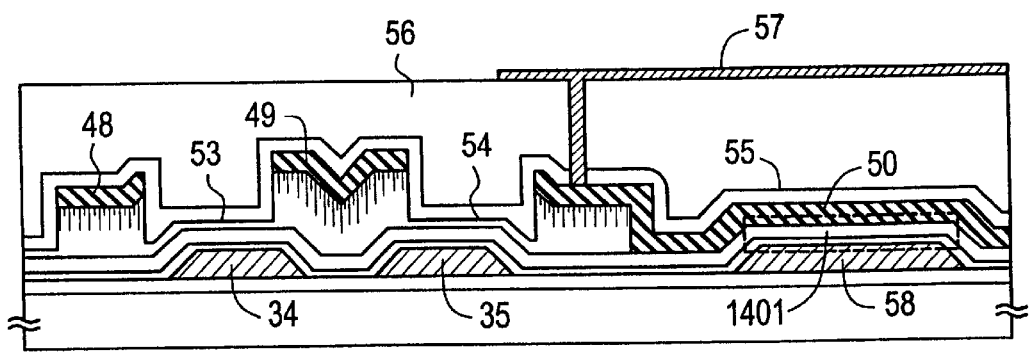

FIG. 14B is a sectional view taken along line A–A' in FIG. 14A. Although not shown in FIG. 13C, as shown in FIG. 14B, a capacitance wiring 58 is formed parallel to the gate wiring.

This capacitance wiring 58 forms storage capacitance (Cs) at a region (region surrounded by a dotted line) where the capacitance wiring overlaps with the drain electrode 50. At this time, the gate insulating layer serves as a dielectric of the auxiliary capacitance. Incidentally, the structure of the storage capacitance is not limited to this embodiment.

[Embodiment 14]

In this embodiment, an example in which an active matrix type display device is manufactured with a process different from the steps shown in the embodiment 13 will be described.

The feature of this embodiment is that after crystallization using a catalytic element, a step of improving the crystallinity by laser annealing is not carried out. That is, after the crystallization, an adding step of phosphorus, a gettering step of a catalytic element, and the like are directly carried out similarly to the embodiment 13.

Figure 15:
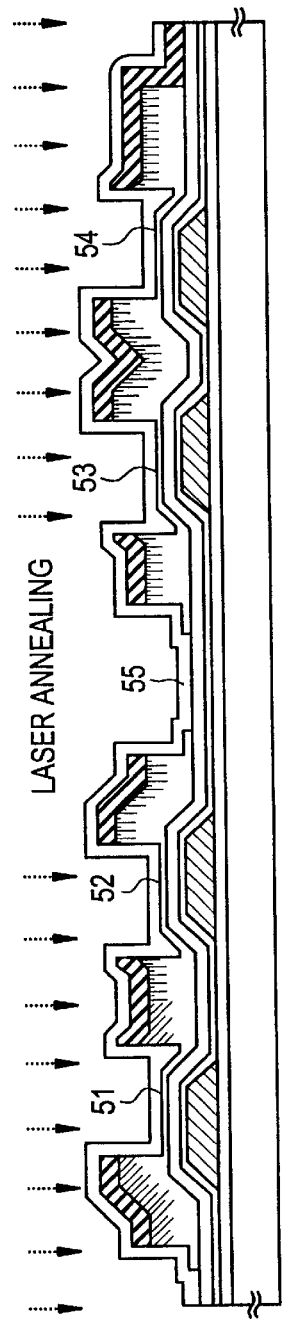
FIG. 15 is a view showing a manufacturing step of a semiconductor circuit of Embodiment 14.

The feature of this embodiment is that a step of improving crystallization of a channel formation region (activation of impurities, recrystallization, and the like) is carried out after a protective film 55 is provided as shown in FIG. 15. That is, irradiation of laser light is performed through the protective film 55 made of a silicon nitride oxide film, and is carried out to the channel formation regions 51 to 54 in a self-aligning manner.

In this way, when laser annealing is carried out in the state of FIG. 15, it is possible to suppress the out diffusion of impurities, such as phosphorus or boron, from the source/drain regions. Moreover, it is possible to obtain an advantage that the power of laser light (laser energy) can be roughly reduced to half.

This embodiment is not limited to the structure shown in the drawing. An operator may select a an optimum structure in view of the merits of the respective TFT structures described in the embodiments 1 to 4 and make circuit design. This embodiment may be combined with any structure shown in all the other embodiments.

[Embodiment 15]

In this embodiment, an example in which the laser annealing step after crystallization in the embodiment 13 is omitted, will be described. In the case of this embodiment, after the crystallization step, phosphorus is added by using an ion doping method and a gettering step of a catalytic element is carried out by the RTA.

Next, boron is added by the ion doping method to form a $p^{++}$ layer 41 and a $p^-$ layer 42 on a semiconductor layer which becomes a PTFT. Reference numerals 38 and 39 denote an $n^+$ layer and an $n^-$ layer, respectively.

Figure 16A:
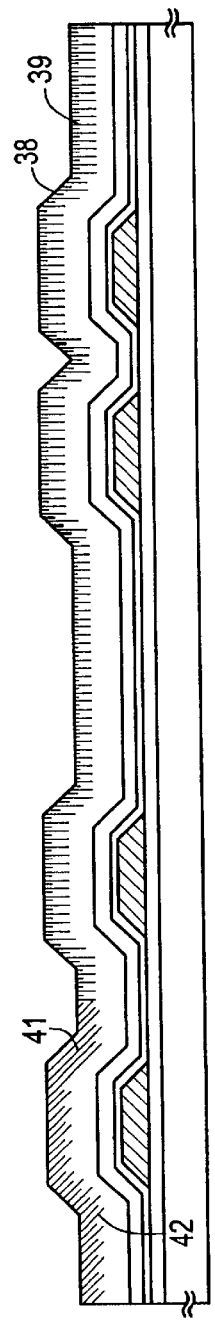
FIGS. 16A and 16B are views showing manufacturing steps of a semiconductor circuit of Embodiment 15.
Figure 16B:
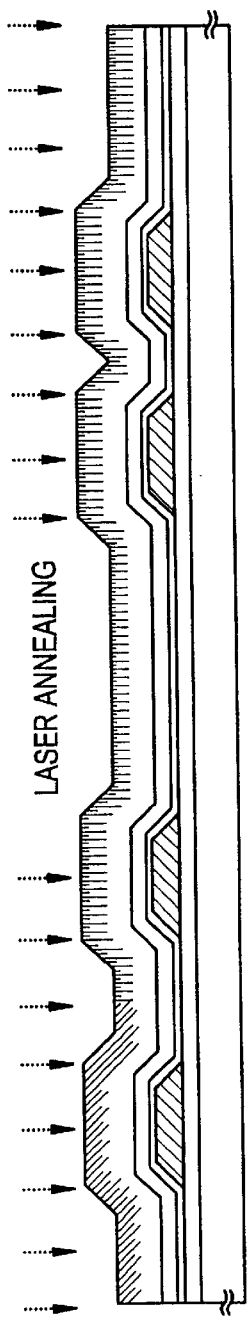

In this state, an annealing step by the RTA is carried out. In this embodiment, activation of added impurities (phosphorus and boron) and dehydrogenating of the semiconductor layer (since hydrogen as well as phosphorus and boron is implanted by the ion doping without mass separation) are carried out by the annealing process of the RTA (FIG. 16A).

Next, a laser annealing step is carried out to recrystallize the semiconductor layer, which has been made amorphous by the adding step of impurities, to improve its crystallinity. The laser annealing step may be carried out after the semiconductor layer is etched and is processed into an island-like layer.

Subsequent steps may follow the embodiment 13. Incidentally, this embodiment is not limited to the structure shown in the drawing. An operator may select an optimum structure in view of the merits of the respective TFT structures described in the embodiments 1 to 4 and make circuit design. Besides, this embodiment may be combined with any structure shown in all the other embodiments.

[Embodiment 16]

In this embodiment, an example in which an active matrix circuit is manufactured by using a structure different from the embodiments 13 to 15 will be described.

Figure 17A:
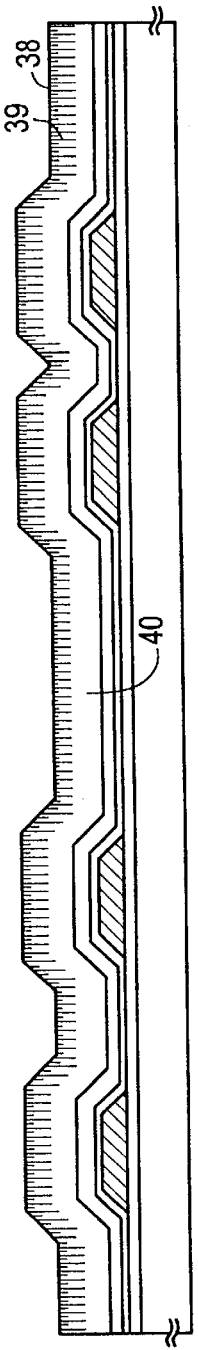
FIGS. 17A to 17D are views showing manufacturing steps of a semiconductor circuit of Embodiment 16.
Figure 17B:
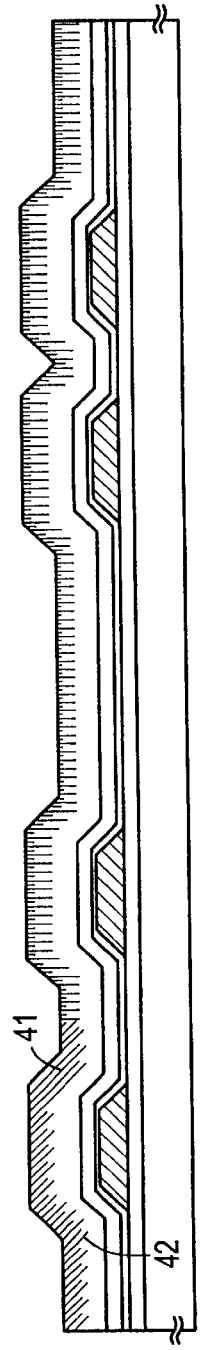

First, an adding step of phosphorus is carried out for a crystalline semiconductor layer formed in accordance with the steps of the embodiment 1. In this way, an $n^+$ layer 38, an $n^-$ layer 39, and an i layer 40 are formed. In this way, after the state shown in FIG. 17A is obtained, an adding step of boron is next carried out for a region, which becomes a PTFT, to form a $p^{++}$ layer 41 and a $p^-$ layer 42 (FIG. 17B).

Next, annealing by the RTA is carried out and a gettering step of a catalytic element (in this embodiment, nickel) is carried out. The feature of this embodiment is that the gettering effect by phosphorus can be obtained in the NTFT, and the gettering effect by phosphorus+boron can be obtained in the PTFT (FIG. 17C).

Figure 17C:
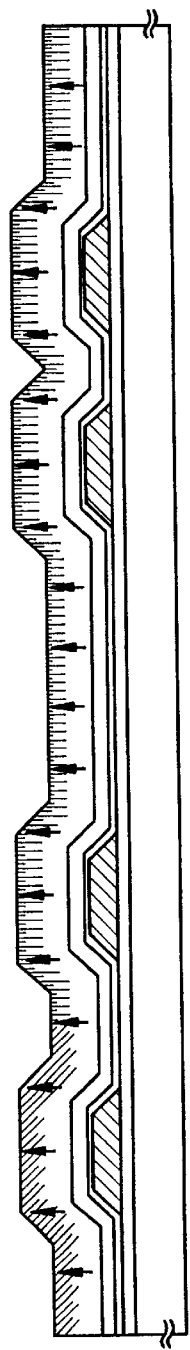
Figure 17D:
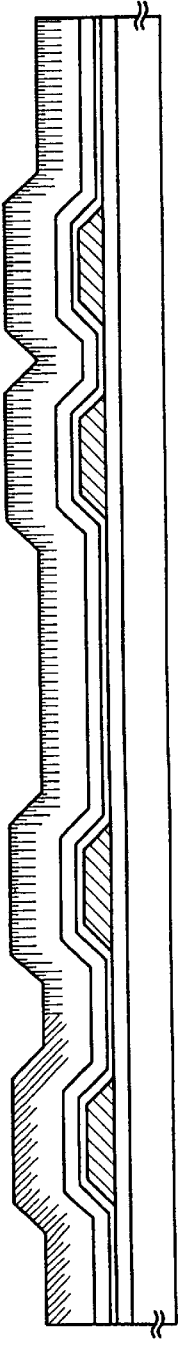

After the state of FIG. 17C is obtained in this way, a laser annealing step is carried out to improve the crystallinity of the semiconductor layer which has been made amorphous by the impurity addition. Incidentally, the gettering step by the RTA shown in FIG. 17B serves also as dehydrogenating of the semiconductor layer. Thus, even if a large amount of hydrogen exists in the film by the impurity addition, a bumping phenomenon of hydrogen does not occur.

Incidentally, the recrystallization step by the laser annealing may be carried out after the semiconductor layer is etched and processed into an island-like semiconductor layer.

Subsequent steps may follow the embodiment 13. Incidentally, this embodiment is not limited to the structure shown in the drawing. An operator may select an optimum structure in view of the merits of the respective TFT structures described in the embodiments 1 to 4 and make circuit design. Further, this embodiment may be combined with any structure shown in all the other embodiments.

[Embodiment 17]

Figure 18A:
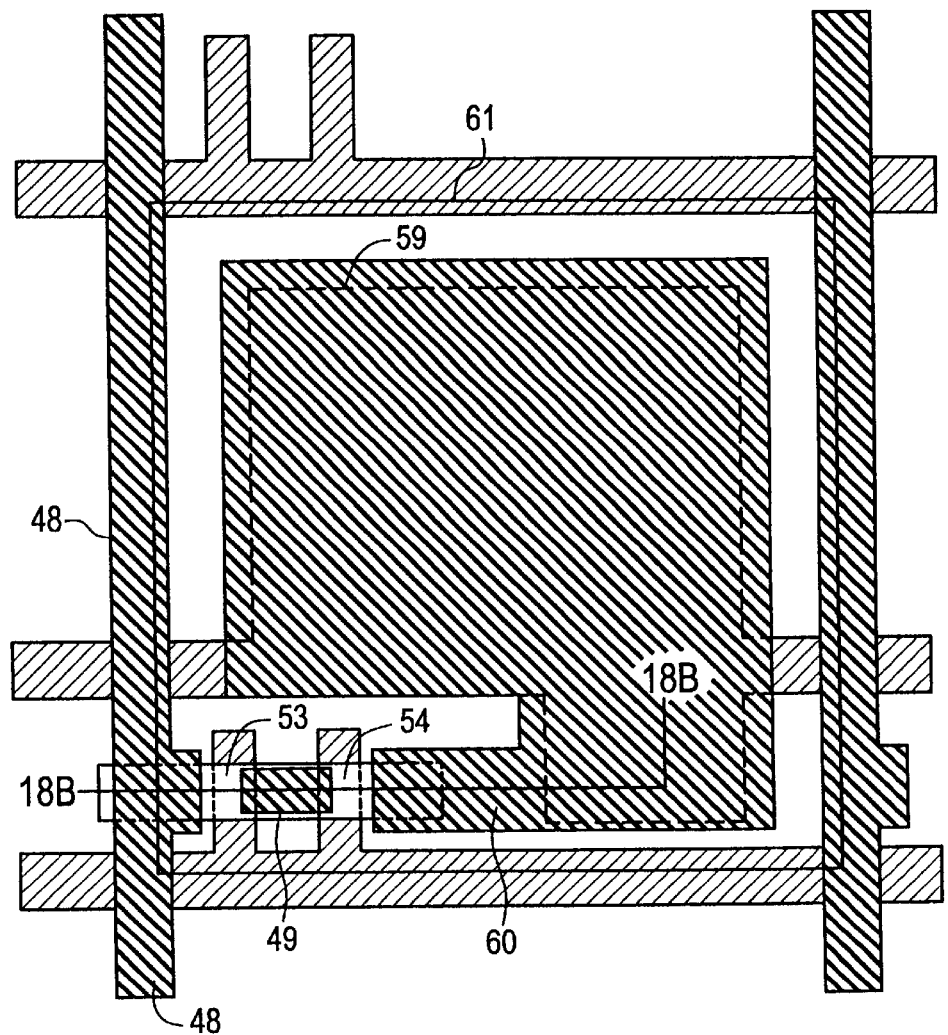
FIGS. 18A and 18B are views showing the structure of a pixel matrix circuit of Embodiment 17.

In this embodiment, an example in which a reflection type liquid crystal display device is manufactured on the basis of the manufacturing steps shown in the embodiment 13, will be described. Here, FIG. 18A is a top view showing an arbitrary pixel of a pixel matrix circuit of the reflection type liquid crystal display device.

Figure 18B:
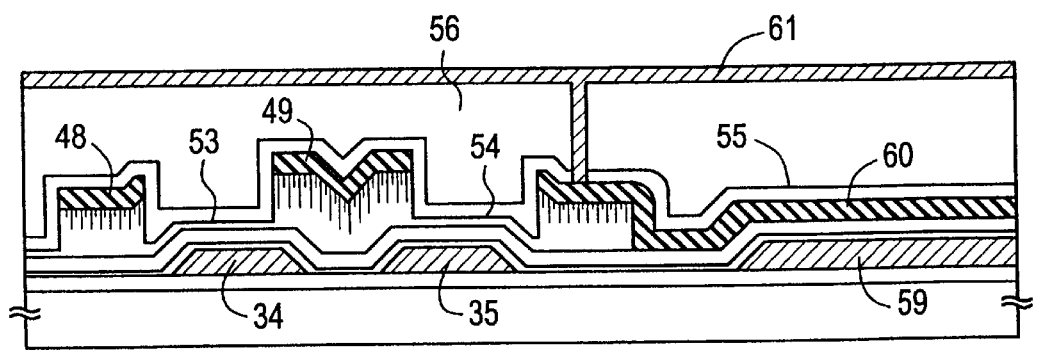

The same portions as those explained in the embodiment 13 are denoted by the same characters and the detailed description will be omitted. FIG. 18B is a sectional view taken along line B–B' of FIG. 18A.

First, the point different from the embodiment 13 is that a capacitance wiring 59 extends to the entire surface of the pixel. Since the reflection type is not required to raise an opening rate contrary to the transmission type, all the rear side of a pixel electrode 61 can be freely used.

In the case of this embodiment, a drain electrode 60 is also extended to all the surface of the pixel and is arranged to overlap with the capacitance wiring 59 in a region as wide as possible. By doing so, almost all portion in the pixel can be used as storage capacitance, so that large capacitance can be secured.

The pixel electrode 61 is a reflective electrode, and it is preferable to use aluminum having high reflectivity or a material containing aluminum as the main ingredient. If the liquid crystal display device of this embodiment is used for a projection type display device, it is preferable that the surface of the pixel electrode is flat. On the contrary, when the device of this embodiment is used for a direct view type display device, it is necessary to contrive a means for widening a visual field angle by, for example, increasing a coefficient of diffused reflection by making asperities on the surface.

Incidentally, this embodiment is not limited to the structure shown in the drawing. An operator may select an optimum structure in view of the merits of the respective TFT structures described in the embodiments 1 to 4 and make circuit design. Further, this embodiment may be combined with any structure shown in all the other embodiments.

[Embodiment 18]

In this embodiment, the structure of a BM (Black Matrix) in the liquid crystal display device shown in the embodiment 13 will be described.

First, in accordance with the manufacturing steps of the embodiment 13, steps up to the formation of the interlayer insulating film 56 are carried out. In this embodiment, an acryl resin having photosensitivity is used for the interlayer insulating film 56. Then, after the interlayer insulating film 56 is patterned, half etching is carried out to form recess portions 65 and 66 (FIG. 19A).

After the state shown in FIG. 19A is obtained, a black resin (not shown) is formed on the entire surface. Graphite, carbon, or organic resin containing pigment etc. may be used as the black resin. Polyimide, acryl, or the like may be used for the organic resin film. In this embodiment, a photosensitive acrylic resin with dispersed graphite is used.

After the black resin is formed in this way, only the regions where the recess portions 65 and 66 have been formed are selectively exposed so that it is possible to leave the black resin only at those portions. Thereafter, it is also effective to carry out ashing in an oxygen plasma atmosphere to raise flatness.

After black matrices 67 and 68 made of the black resin are formed in this way, a pixel electrode 69 formed of an ITO film is next formed. In this embodiment, the pixel electrode 69 is patterned so that the end of the pixel electrode 69 and the end of the black matrix overlap with each other (the end surface of the pixel electrode is positioned inside of the BM).

In the manner described above, the active matrix substrate having the structure as shown in FIG. 19B is completed. Hereafter, when a well known cell assembling step is carried out, the liquid crystal display device can be manufactured. The black matrix as in this embodiment has an advantage that parasitic capacitance is not formed between the black matrix and other wiring.

Incidentally, this embodiment is not limited to the structure shown in the drawing. An operator may select an optimum structure in view of the merits of the respective TFT structures described in the embodiments 1 to 4 and make circuit design. Further, this embodiment may be combined with any structure shown in all the other embodiments.

[Embodiment 19]

In this embodiment, an example in which a black matrix different from the embodiment 18 is used will be described. Concretely, an example in which a conductive film is used for the black matrix will be described.

In FIG. 20, reference numeral 56 denotes an interlayer insulating film made of an organic resin film, and 71 to 74 denotes black matrices made of conductive films or wiring patterns serving also as black matrices. As the conductive film, a titanium film, a chromium film, a lamination film of titanium and aluminum, or the like may be used.

Since the black matrix of this embodiment is conductive, there are various uses other than the role as the black matrix. First, a pattern designated by 71 is a black matrix fixed to a common potential (ground potential). A pattern designated by 72 is connected to the drain electrode of a CMOS circuit and is used as lead wiring. Like this, when this embodiment is used, a multilayer wiring structure can be easily realized.

A pattern designated by 73 is connected to the source electrode of the CMOS circuit, and has a function as connection wiring and a function as the black matrix. A pattern designated by 74 is a black matrix arranged in a pixel matrix circuit, and basically provided on the wiring or TFT.

Then an interlayer insulating film 75 is again provided on the black matrices (or wiring serving also as the black matrix) 71 to 74. This interlayer insulating film 75 is formed of a silicon oxide film, a silicon nitride film, a silicon nitride oxide film, an organic resin film, or a lamination film thereof. This interlayer insulating film 75 subsequently functions as a dielectric of storage capacitance.

After the interlayer insulating film 75 is formed in this way, a contact hole is formed and a pixel electrode 76 made of ITO is formed. In the pixel matrix circuit, a storage capacitance 77 is formed between the black matrix 74 and the pixel electrode 76.

Figure 21:
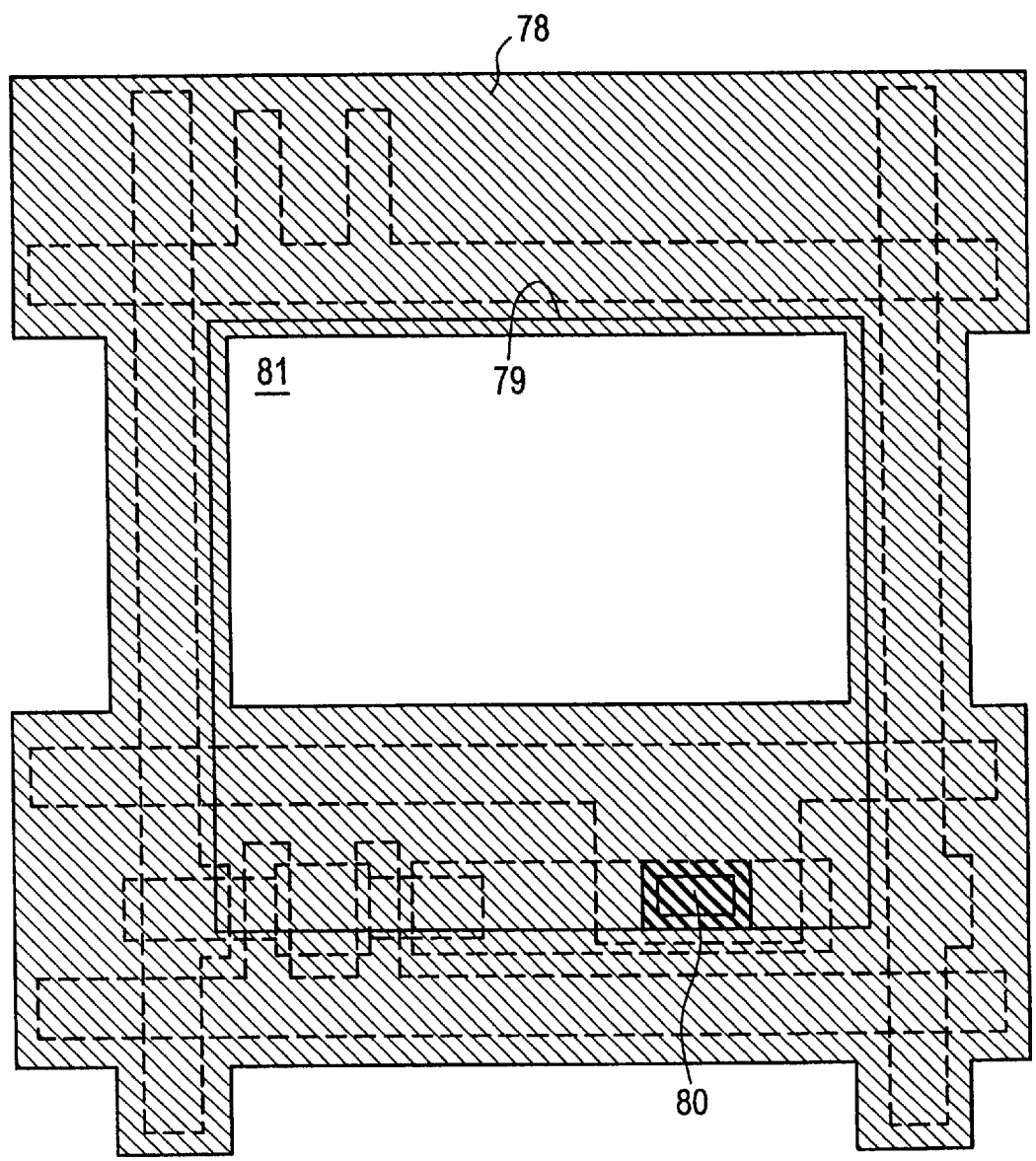
FIG. 21 is a view showing the structure of a pixel matrix circuit of Embodiment 19.

FIG. 21 shows an example of arrangement of a black matrix of a pixel matrix circuit. FIG. 21 shows the example of arrangement in the case where the black matrix 78 is overlapped with the structure shown in FIG. 14A. A thick line denoted by 79 indicates a pixel electrode, and 80 denotes a contact portion between the pixel electrode 79 and a drain electrode below.

The black matrix 78 basically covers the wiring or TFT, and has openings at only a picture display region 81 and the contact portion 80. In the transmission type liquid crystal display device as in this embodiment, the most important problem is to decrease the occupied area of the black matrix and to widen the area of the picture display region 81 (improve the aperture ratio).

Incidentally, this embodiment is not limited to the structure shown in the drawing. An operator may select an optimum structure in view of the merits of the respective TFT structures described in the embodiments 1 to 4 and make circuit design. Further, this embodiment may be combined with any structure shown in all the other embodiments.

[Embodiment 20]

In this embodiment, description will be made to an example in which an active matrix substrate is manufactured with a TFT structure different from the structure shown in the embodiment 13.

Figure 22:
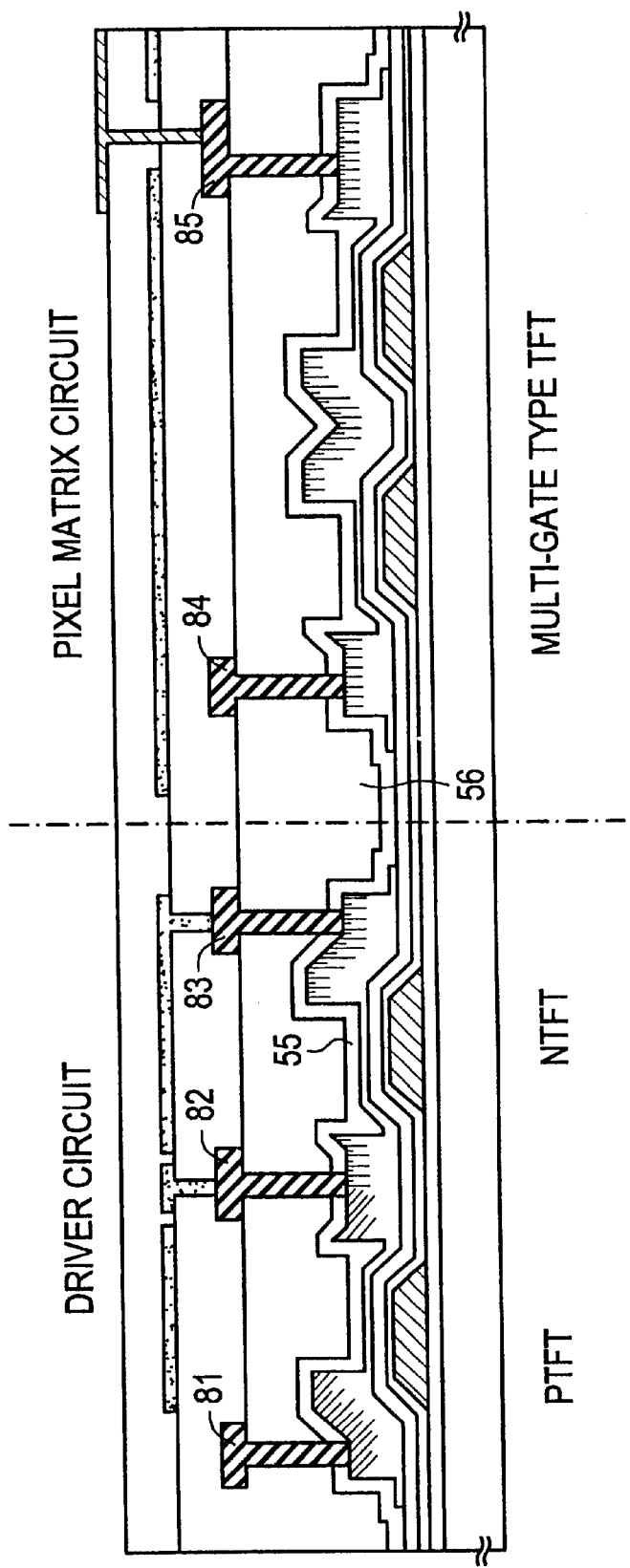
FIG. 22 is a view showing the structure of a pixel TFT of Embodiment 20.

The most important point in the structure shown in FIG. 22 is that the uppermost portion of each semiconductor layer (source/drain regions) is a first conductive layer (n⁺ region or p⁺⁺ region), and each conductive layer is temporarily covered with a protective film 55 and an interlayer insulating film 56, and then lead electrodes 81 to 85 are electrically connected.

In the case of making such structure, a channel etching step at the formation of a channel formation region is carried out by using a resist mask. Then the protective film 55 and the interlayer insulating film 56 are formed and the lead electrodes 81 to 85 are formed.

Like the structure of this embodiment, when the respective lead electrodes (functioning as source/drain electrodes or drawing wiring) 81 to 85 are separated from the gate electrode by the interlayer insulating film 56, parasitic capacitance between the source/drain electrodes and the gate electrode can be further decreased. It is further effective if an organic resin material having a small relative dielectric constant is used for the interlayer insulating film 56.

Incidentally, the structure of this embodiment can be applied to the TFT shown in the embodiments 1 to 4, and it is needless to say that the structure can be combined with any of the other embodiments. Moreover, this embodiment is not limited to the structure shown in the drawing. An operator may select an optimum structure in view of the merits of the respective TFT structures described in the embodiments 1 to 4 and make circuit design.

[Embodiment 21]

Figure 23:
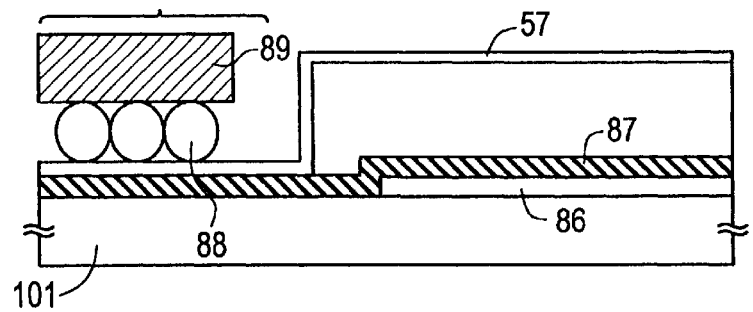
FIG. 23 is a view showing the structure of an external terminal attaching portion of Embodiment 21.

In this embodiment, description will be made to connection structure to an external terminal in an active matrix substrate having the structure shown in the embodiments 13 to 20. FIG. 23 is an enlarged view showing an end portion (hereinafter referred to as an FPC attachment portion) connected to the external terminal (typically a flexible printed circuit (FPC)), which positions at the end of the active matrix circuit.

In FIG. 23, reference numeral 101 denotes a glass substrate, and 86 denotes an insulating layer which is actually constituted by the lamination structure of the under film 102, the silicon nitride film 104, and the silicon nitride oxide film 105 shown in FIG. 1A. A second wiring layer 87 is formed thereon. The second wiring layer 87 is a connection wiring layer for transmitting a signal from the external terminal to source/drain electrodes, a gate electrode, and the like.

The first feature of this embodiment is that the second wiring layer 87 is in direct contact with the glass substrate 101. In order to realize this structure, in the third patterning step explained in the embodiment 1, it is necessary to completely remove the insulating layer 86 existing at the FPC attachment portion shown in FIG. 23. If the underlayer of the second wiring layer 87 is made a hard glass substrate, it is possible to make firm press attachment of the FPC.

Moreover, in the FPC attachment portion, the interlayer insulating film 56 is also partially removed in a subsequent step to make such a structure that the ITO film 57 thereon is brought into contact with the second wiring layer 87. It is sufficient if the ITO film 57 is laminated on the second wiring layer 87 at least at the FPC attachment portion, and according to circumstances, an electrode pad instead of the ITO film may be formed only at the FPC attachment portion as an independent pattern.

The ITO film 57 functions as a buffer layer to make an ohmic contact excellent in such a manner that when an anisotropic conductive film 88 is formed later, conductive particles (silica glass coated with gold, and the like) contained in the anisotropic conductive film 88 are fallen in the ITO film 57.

After the FPC attachment portion is made to have the structure as shown in FIG. 23, an FPC terminal 89 is press fitted by using the anisotropic conductive film 88. In this way, the connection structure as shown in FIG. 23 can be realized. If such connection structure is applied to the active matrix substrate shown in the embodiments 13 to 20, excellent electrical connection to an external terminal becomes possible.

[Embodiment 22]

In this embodiment, description will be made to a contrivance for improving efficiency of patterning at the formation of a TFT of the present invention on a large glass substrate.

In the case where a minute semiconductor circuit is formed on a large glass substrate, a patterning error due to a warp or a shrinkage of the glass substrate becomes a problem. Thus, attention has been paid to a light exposure method using a light exposing apparatus called a stepper. In the stepper light exposure, it is possible to partially expose only a part in one reticle.

In the case of this embodiment, necessary circuit patterns such as a driver circuit and a pixel matrix circuit are formed for each part in one reticle 90. At this time, a region of repetition of the same structure is formed by repetition exposure of the same circuit pattern.

Figure 24:
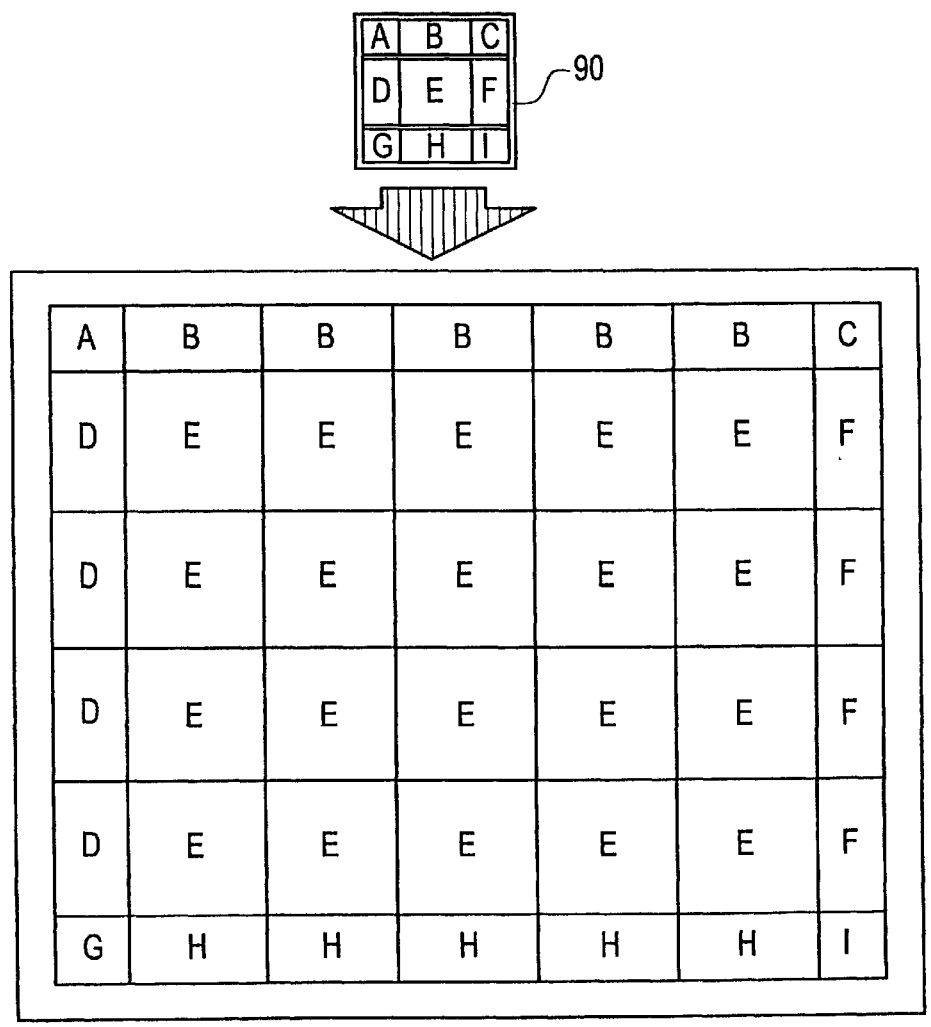
FIG. 24 is a view showing the structure with respect to a light exposure processing method of a semiconductor circuit of Embodiment 22.

In FIG. 24, patterns A, C, G, and I are circuit patterns for forming the end of a driver circuit. Patterns B and H are repetition circuit patterns of a horizontal scanning driver circuit, and patterns D and F are repetition circuit pattern of a vertical scanning driver circuit. Pattern E is a repetition circuit pattern for a pixel matrix circuit.

Like this, in the driver circuit or the pixel matrix circuit which is made of continuous connection of circuits having the same structure, only the ends are formed of exclusive circuit patterns, and the completely same circuit pattern is repeatedly used in the inside to form the entire pattern.

When this system is used, since a circuit pattern is commonly used, the number of circuit patterns written into one reticle becomes small, and the reticle can be reduced. Moreover, since any large substrate can be dealt with by using one reticle repeatedly, a time of mask change can be omitted so that the throughput is improved.

For example, in the case where the pixel matrix circuit is in SXGA, 1280 pixels are lined in the row direction, and 1024 pixels are lined in the column direction. Thus, if pattern circuits corresponding to 256 pixels are written in the row direction of the foregoing pattern E, five repetition exposures are sufficient for the row direction. If pattern circuits corresponding to 256 pixels are written in the column direction, four repetition exposures are sufficient for the column direction.

Like this, when the number of repetition exposures in the row direction and the column direction is respectively m and n, and the number of pixels in the row direction and the column direction is respectively X and Y, in the circuit pattern for forming a pixel matrix circuit, it is necessary to write X/n pixel patterns in the row direction and Y/m pixel patterns in the column direction. When this regularity is used, it is possible to easily realize a highly minute display such as ATV (advanced TV) of 1920×1080 pixels.

[Embodiment 23]

In this embodiment, description will be made to an example in which an AMLCD (Active Matrix Liquid Crystal Display) is constituted by using an active matrix substrate having the structure shown in the embodiment 13 to 20. In the AMLCD of this embodiment, a driving circuit and a pixel matrix circuit are constituted by inverted stagger type TFTs manufactured on the same substrate. Since the circuit structure of the driving circuit is constructed by a CMOS circuit as a base, consumed electric power is low.

Figure 25A:
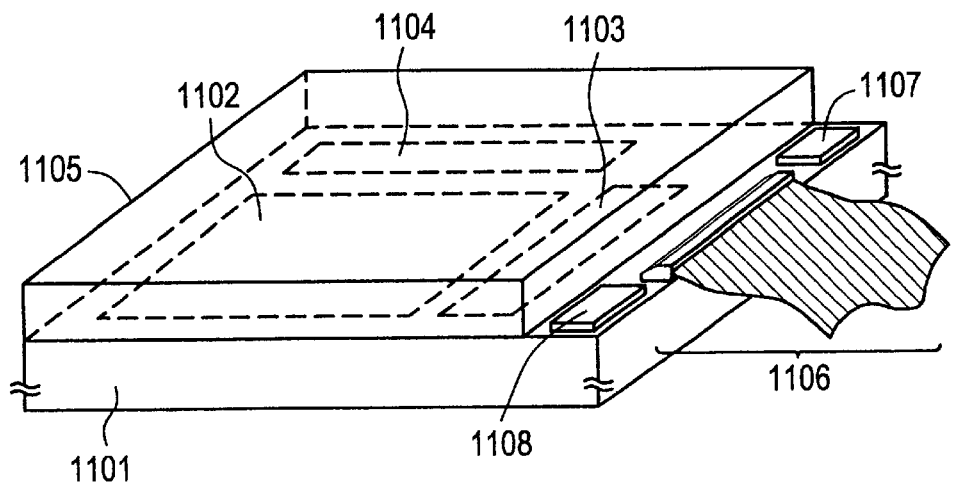
FIGS. 25A and 25B are views showing the structure of an electrooptical device of Embodiment 23.
Figure 25B:
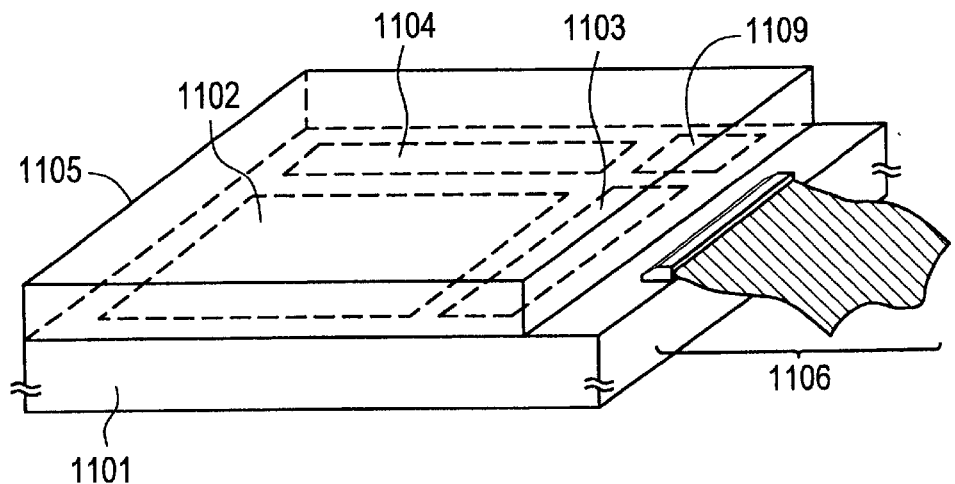

FIGS. 25A and 25B show an outer appearance of the AMLCD of this embodiment. In FIG. 25A, reference numeral 1101 denotes an active matrix substrate, and thereon, a pixel matrix circuit 1102, a source side driving circuit 1103, and a gate side driving circuit 1104 are constituted by TFTs of the present invention. Reference numeral 1105 denotes an opposite substrate.

In the AMLCD of this embodiment, the active matrix substrate 1101 and the opposite substrate 1105 are bonded to each other in such a manner that the end faces thereof are flush with each other. However, only a part of the opposite substrate 1105 is removed and an FPC (flexible print circuit) 1106 is connected to the exposed active matrix substrate. An external signal is transmitted into the inside of the circuit by this FPC 1106.

By using the surface where the FPC 1106 is attached, IC chips 1107 and 1108 are attached. These IC chips are constituted by forming various circuits such as a processing circuit of a video signal, a timing pulse generation circuit, a γ correction circuit, a memory circuit, and a processing circuit on a silicon substrate. In FIG. 25A, the two IC chips are attached, it is sufficient even if one IC chip is mounted or a plurality of IC chips are mounted.

It is also possible to adopt the structure as shown in FIG. 25B. In FIG. 25B, the same portions as FIG. 25A are given the same characters. Here, an example in which signal processing carried out by the IC chips in FIG. 25A is carried out by a logic circuit 1109 formed of TFTs on the same substrate, is shown.

In this case, the logic circuit 1109 is also constituted by a CMOS circuit as a base like the driving circuit 1103 and 1104, and it is possible to manufacture the logic circuit with inverted stagger type TFTs using the present invention.

The TFT using the present invention can be used as a switching element of an EL (electroluminescence) display device other than a switching element for the AMLCD. Moreover, a circuit such as an image sensor can also be formed by the bottom gate type TFT of the present invention.

As described above, by the TFTs using the present invention, various electrooptical devices can be manufactured. Incidentally, the electrooptical device in the present specification is defined as a device for converting an electric signal into an optical signal, or vice verse.

In manufacturing of the AMLCD of this embodiment, the black matrix may be provided on the opposite substrate side, or may be provided on the active matrix substrate (BM on TFT).

Color display may be made by using a color filter, or the structure not using the color filter may be adopted by driving a liquid crystal with an ECB (Electric field Control Birefringence) mode or GH (Guest Host) mode.

Like the technique disclosed in Japanese Patent Laid-Open No. Hei 8-15686, a structure using a microlens array may be adopted.

[Embodiment 24]

The AMLCD shown in the embodiment 23 is used as a display for various electronic equipments. Incidentally, the electronic equipment in this embodiment is defined as a product which is provided with an electrooptical device typified by the AMLCD.

As such electronic equipment, a video camera, a still camera, a projector, a projection TV, a head mount display, a car navigation system, a personal computer (including a note-sized computer), a portable information terminal (mobile computer, portable telephone, etc.) and the like are enumerated. FIGS. 26A to 26F shows examples of these electronic equipments.

Figure 26A:
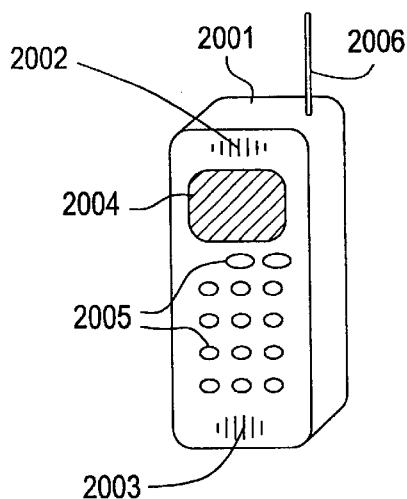
FIGS. 26A to 26F are views showing structures of electronic equipments of Embodiment 24.

FIG. 26A shows a portable telephone which is constituted by a main body 2001, an audio output portion 2002, an audio input portion 2003, a display device 2004, an operation switch 2005, and an antenna 2006. The present invention can be applied to the display device 2004 and the like.

Figure 26B:
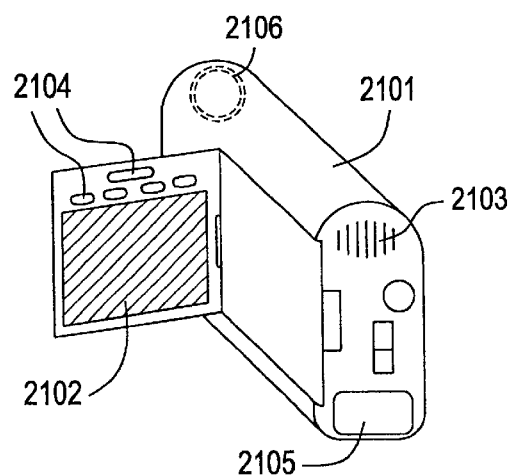

FIG. 26B shows a video camera which is constituted by a main body 2101, a display device 2102, an audio input portion 2103, an operation switch 2104, a battery 2105, and an image receiving portion 2106. The present invention can be applied to the display device 2102.

Figure 26C:
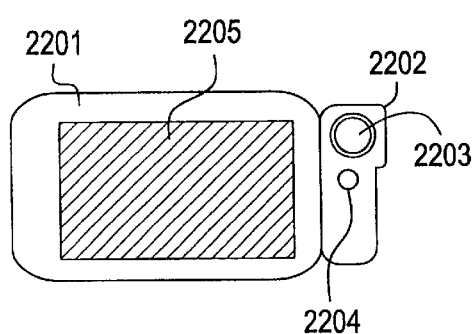

FIG. 26C shows a mobile computer which is constituted by a main body 2201, a camera portion 2202, an image receiving portion 2203, an operation switch 2204, and a display device 2205. The present invention can be applied to the display device 2205 and the like.

Figure 26D:
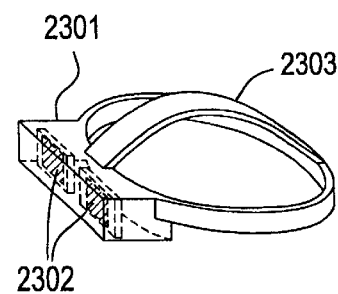

FIG. 26D shows a head mount display which is constituted by a main body 2301, a display device 2002, and a band portion 2303. The present invention can be applied to the display device 2302.

Figure 26E:
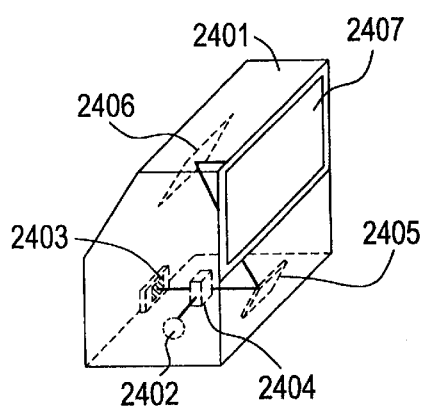

FIG. 26E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 26F:
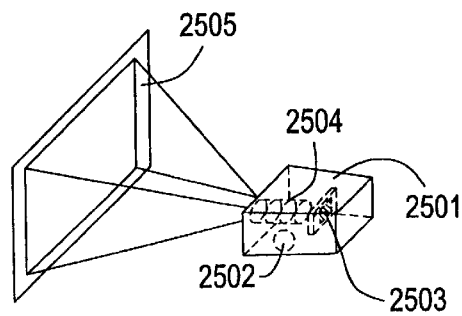

FIG. 26F shows a front type projector which is constituted by a main body 2501, a light source 2502, a display device 2503, an optical system 2504, and a screen 2505. The present invention can be applied to the display device 2503.

As described above, the scope of application of the present invention is extremely wide and the present invention can be applied to electronic equipments of any field. Other than those, the present invention can also be practically used for a video billboard, an advertising display, and the like.

[Embodiment 25]

In this embodiment, description will be made to a structural example of a circuit constituted by using inverted stagger type TFTs of the present invention. First, an example of a case where a shift resister is constituted will be described with reference to FIGS. 27A and 27B. In this embodiment, the layer structure shown in the embodiment 13 is adopted.

Figure 27A:
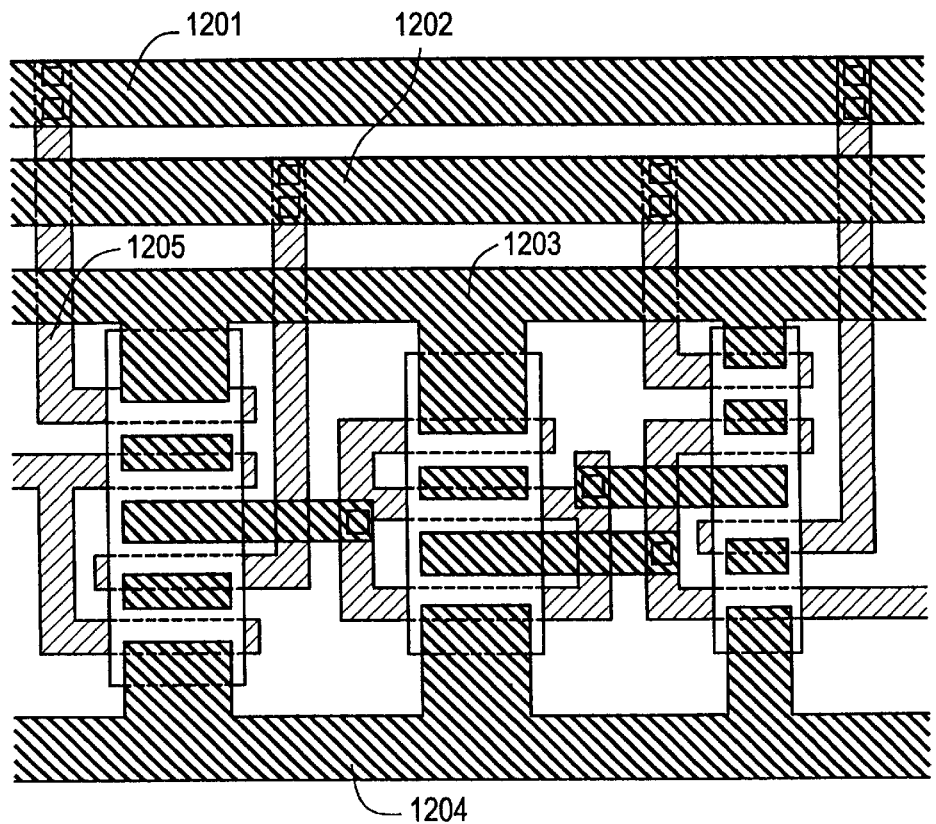
FIGS. 27A and 27B are views showing the pattern structure of a semiconductor circuit of Embodiment 25.
Figure 27B:
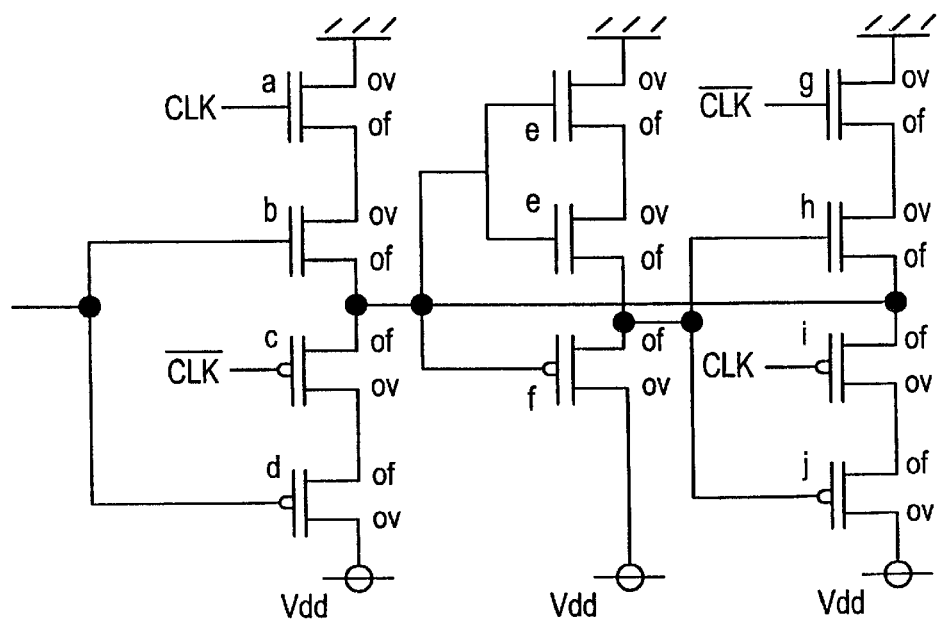

FIG. 27A shows a circuit pattern in which only any one stage is taken out of the shift register circuit, and FIG. 27B is a view showing its equivalent circuit. In this embodiment, since FIG. 27A substantially corresponds to FIG. 27B in the positional relation, in the explanation of FIG. 27A, characters in FIG. 27B will be referred to as the need arises.

In FIG. 27A, a circuit constituted by TFT(a) to TFT(d) and TFT(g) to TFT(j) is a clocked inverter circuit, and a circuit constituted by TFT(e) and TFT(f) is an inverter circuit. The TFT(e) uses a TFT of double gate structure.

Reference numeral 1201 denotes a CLK line (clock signal line), 1202 denotes an inverted CLK line (inverted clock signal line), 1203 denotes a GND wiring line (ground line), and 1204 denotes a Vdd line (power source line). All the wiring lines indicated by the patterns of these oblique lines having a tilt to the upper left are the second wiring layers (designated by 45 to 50 in FIG. 13A).

Moreover, for example, a wiring line designated by 1205 functions as a gate electrode of the TFT(a). Like this, all the wiring layers indicated by the patterns of oblique lines having a tilt to the upper right are the first wiring layers (designated by 32 to 35 in FIG. 12A), and the portion where the first wiring layer and the semiconductor layer overlap with each other will be referred to as a gate electrode.

In this embodiment, an overlap region (denoted by "ov" in the drawing) is provided at the source side of the TFT, and a mask offset region (denoted by "of" in the drawing) is provided at the drain side. Thus, in FIG. 27B, when the clocked inverter circuit constituted by the TFT(a) to TFT(d) is cited as an example, the regions ov/of/ov/of/of/ov/of/ov are sequentially formed from the above.

That is, in the portions of the TFT(a) and TFT(b), since they are almost the same structure as the double gate structure of the pixel TFT described in the embodiment 13, regions are repeated like ov/of/ov/of. In the portions of the TFT(b) and TFT(c), since the CMOS structure in which the drain electrode is made common between the NTFT and PTFT is constructed, as described in the embodiment 5, the structure such as ov/of/of/ov is formed.

Other circuits are also basically the same, and since the TFT(e) has a double gate structure, the respective TFT structures are determined to make such a structure of regions ov/of/ov/of formed sequentially from the side connected to the GND line 1203.

By the structure as described above, it is possible to construct a semiconductor circuit having high withstand voltage and high reliability without decreasing operation speed. By using such a semiconductor circuit, it is possible to raise the reliability of an electrooptical device.

[Embodiment 26]

In this embodiment, a structural example of a circuit constituted by inverted stagger type TFTs of the present invention will be described. First, an example in which a buffer circuit (left side in the drawing) and an analog switch circuit (right side in the drawing) are constituted, will be described with reference to FIGS. 28A and 28B. In this embodiment, the layer structure shown in the embodiment 20 is adopted. FIG. 28A shows a circuit pattern, and FIG. 28B is a view showing its equivalent circuit.

In the circuit pattern of FIG. 28A, TFT(a') to TFT(h') are TFTs using the present invention. The TFT(a'), TFT(b') and the TFT(C'), TFT(d') respectively constitute one buffer circuit. Since the buffer circuit operates at the maximum operation voltage in the liquid crystal display device like a pixel matrix circuit, high withstand voltage characteristics are required.

Pairs of TFT(e') and TFT(f') and TFT(g') and TFT(h') respectively constitute one analog switch circuit. Since the analog switch circuit is also operated at an operation voltage similar to the pixel matrix circuit, high withstand voltage characteristics are required.

Here, attention is paid to the buffer circuit constituted by the TFT(a') and TFT(c') and explanation will be made. Reference numeral 1201 denotes a source electrode (Vdd line) of the TFT(a'), 1202 denotes a source electrode (GND line) of the TFT(c'), 1203 denotes a common drain electrode (output signal line) of the TFT(a') and TFT(c'), and 1204 denotes a common gate electrode (input signal line).

Reference numeral 1205 denotes a first conductive layer ($n^+$ layer) at the drain region side, 1206 denotes a first conductive layer ($n^+$ layer) at the source side, and 1207 denotes an i layer made into a thin film. The TFT(c') has a similar structure, and a $p^{++}$ layer is provided instead of the $n^+$ layer.

This buffer circuit adopts the structure shown in the embodiment 5 in order to obtain high withstand voltage characteristics. That is, an overlap region (ov) is formed at the source side, and a mask offset region (of) is formed at the drain side. By this, it is possible to increase the withstand voltage only at the drain region side and to decrease resistance at the source region side.

This structure is adopted also for the buffer circuit constituted by the TFT(b') and TFT(d').

Next, explanation will be made while paying attention to the analog switch circuit constituted by the TFT(e') and TFT(f'). The gate electrode 1204 of the foregoing buffer circuit is connected to the gate electrode of the TFT(e'), and the common drain electrode 1203 of the TFT(a') and TFF(b') is connected to the gate electrode of the TFT(f').

Reference numeral 1208 denotes a common source electrode (input data signal line) of the analog switch circuit, and 1209 denotes a common drain electrode (output data signal line). The common source electrode 1208 corresponds to the TFT(e') and TFT(f'), and the common drain electrode 1209 corresponds to the TFT(g') and TFT(h'). These common electrodes 1208 and 1209 transmit different picture signals, respectively.

At this time, if either one of the TFT(e') and TFT(f') is in an on state, a data signal (picture signal) transmitted from the input data signal line 1208 passes through the output data signal line 1209 and is transmitted to the pixel matrix circuit. Thus, even in the case of the TFT(e') and TFT(f') constituting the analog switch circuit, a mask offset region is provided at the drain side, and an overlap region is provided at the source side.

This structure is also adopted for the buffer circuit constituted by the TFT(g') and TFT(h').

As described above, by using the structure of the present invention to a semiconductor circuit requiring withstand voltage characteristics, a semiconductor circuit having high reliability can be realized. This is also important for manufacturing an electrooptical device with high reliability.

[Embodiment 27]

This embodiment shows an example in which at the formation steps of the gate insulating film and the semiconductor film (amorphous silicon film) in the manufacturing steps of each Embodiment 1 to Embodiment 26, the respective films are continuously formed without being exposed to the atmosphere.

As a method of forming the gate insulating film and the semiconductor film, any method such as plasma CVD method and sputtering method can be employed. However, it is important to prevent contamination materials of the atmosphere (oxygen, boron, metal elements or the like) from attaching to the interface between the gate insulating film and the semiconductor film by avoiding exposure of the films to the atmosphere. In this embodiment, a multi-chamber (for instance, a device shown in FIG. 29) that is provided with an exclusive chamber for forming the gate insulating film and an exclusive chamber for forming starting semiconductor film, is used, and by moving each chamber, the gate insulating film and the semiconductor film are continuously formed so as to form a lamination without being exposed to the atmosphere. Incidentally, it is preferable to reduce the contamination material on the surface, where the semiconductor film is to be formed, by means of active hydrogen or hydrogen compounds before forming the semiconductor film.

Figure 29:
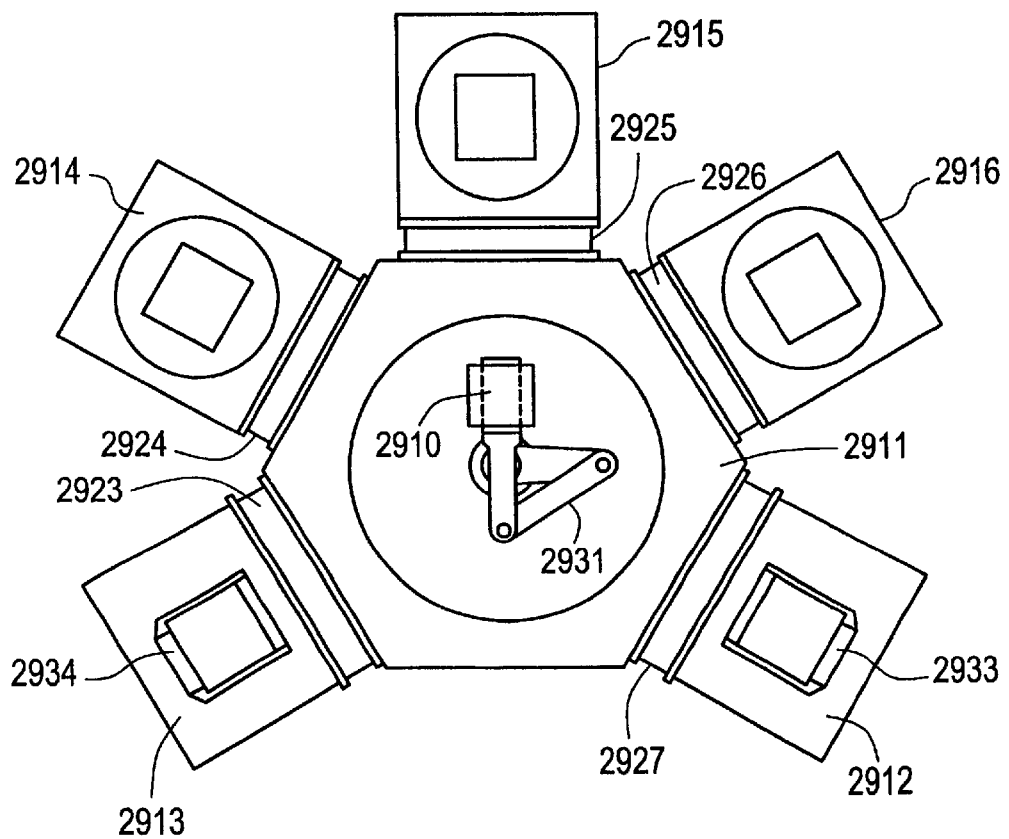
FIG. 29 is a view showing the structure of a multi-chamber of Embodiment 27.

FIG. 29 schematically shows a device (a continuous film formation system) viewed from the top thereof, which will be described in this embodiment. In FIG. 29, reference numerals 2912–2916 denote chambers having air-tight property. A vacuum discharge pump and an inert gas introducing system are arranged in each chamber.

The present embodiment is applied to the cases in which the gate insulating film and the semiconductor film of Embodiment 1 are formed.

Chambers denoted by 2912 and 2913 serve as load-lock chambers for carrying a sample (substrate to be processed) 2910 into the system. Reference numeral 2914 denotes a first chamber for forming the gate insulating film (a first layer). Numeral 2915 denotes a second chamber for forming the gate insulating film (a second layer). Numeral 2916 denotes a third chamber for forming the semiconductor film (amorphous silicon film). Also, numeral 2911 denotes a common chamber of the sample, which is disposed commonly to each chamber. Reference numerals 2923–2927 denote gate valves of each chamber; 2931, a robot arm; 2933 and 2934, cassettes. In this embodiment, the case in which the gate insulating film has a double-layer structure is shown. It is needless to say, however, that the present embodiment is also applicable to a case in which the gate insulating film has a single-layer structure, and for example, to the case in which the gate insulating film is consisted from silicon oxide only.

In this embodiment, in order to prevent the contamination, the gate insulating film and the semiconductor film are formed so as to form a lamination by different chambers from each other utilizing the device shown in FIG. 29. It is a matter of course that the device shown in FIG. 29 is just an example.

Also, an arrangement is applicable in which a lamination is carried out by changing reaction gases within a single chamber. When serial film formation is conducted within the single chamber, it is preferable to reduce the contamination material, in particular, oxygen (because oxygen inhibits the crystallization) on the surface, where the semiconductor film is to be formed, by means of the active hydrogen or hydrogen compounds before forming the semiconductor film. In this case, degassing is carried out by changing oxygen attached to an inner wall of the chamber and electrodes into OH group by utilizing active hydrogen or hydrogen compounds which are generated from plasma process that uses a reaction gas such as hydrogen/$NH_3$, $H_2$, Ar and He. Accordingly, oxygen is prevented from mixing in upon the formation of the semiconductor film at the initial stage. Further, at the formation of each film, the same temperature(±50° C.) and the same pressure (+20%) are preferably used.

With the above arrangement, contamination of the gate insulating film and the semiconductor film is prevented to thereby realize stable and good electrical characteristics.

As described above, according to the present invention, it is possible to manufacture a TFT having high mass productivity with very few number of masks (typically four masks).

Moreover, since an electric field relieving layer (LDD region, mask offset region, thickness offset region, and the like) with small dispersion in characteristics can be formed between the channel formation region and the source/drain electrodes, it is possible to realize a TFT having high reliability and high reproducibility.

Further, the present invention can be applied to a semiconductor device of any mode, such as a semiconductor circuit formed on a substrate by such TFTs, an electrooptical device in which such a semiconductor circuit is combined with a liquid crystal layer and the like, and an electronic equipment provided with the electrooptical device as a display.

What is claimed is:

1. A method of manufacturing a semiconductor device, said method comprising the steps of:

forming a gate electrode, a gate insulating film, and an amorphous semiconductor film over a substrate having an insulating surface;

introducing a catalytic element for promoting crystallization of said amorphous semiconductor film thereinto;

heating said amorphous semiconductor film to form a crystalline semiconductor film;

adding an impurity comprising an element selected from group 15 elements into the crystalline semiconductor film wherein a first portion of said crystalline semiconductor film is added with said element at a higher concentration than a second portion of said crystalline semiconductor film, said second portion located between said first portion and said gate insulating film;

heating the crystalline semiconductor film added with said impurity so that the catalytic element residing in the second portion moves into said first portion;

forming a source electrode and a drain electrode over the crystalline semiconductor film; and etching a part of the crystalline semiconductor film to a depth corresponding to a thickness of said first portion using the source electrode and the drain electrode as a mask to form a channel forming region in said second portion.

2. A method of manufacturing a semiconductor device, said method comprising the steps of:

forming a gate electrode, a gate insulating film, and an amorphous semiconductor film over a substrate having an insulating surface;

introducing a catalytic element for promoting crystallization of said amorphous semiconductor film thereinto;

heating said amorphous semiconductor film to form a crystalline semiconductor film;

adding an impurity comprising an element selected from group 15 elements into the crystalline semiconductor film wherein a first portion of said crystalline semiconductor film is added with said element at a higher concentration than a second portion of said crystalline semiconductor film, said second portion located between said first portion and said gate insulating film;

heating the crystalline semiconductor film added with said impurity so that the catalytic element residing in the second portion moves into said first portion;

forming a source electrode and drain electrode over the crystalline semiconductor film;

etching a part of the crystalline semiconductor film to a depth corresponding to a thickness of said first portion using the source electrode and the drain electrode as a mask to form a channel forming region in said second portion; and adding an impurity for controlling a threshold voltage using the source electrode and the drain electrode as a mask.

3. A method according to claim 1 or 2, further comprising at least one step of carrying out laser annealing of the crystalline semiconductor film.

4. A method according to claim 1 or 2, wherein the catalytic element is an element selected from the group consisting of Ni, Ge, Pt, Co, Fe, Au, Pd, Pb, and Cu.

5. A method according to claim 1 or 2, wherein the impurities selected from only group 15 are phosphorus, and the impurities selected from group 13 and group 15 are boron and phosphorus.

6. A method according to claim 1 or 2, wherein the step of adding the impurities is carried out by an ion implantation method or an ion doping method.

7. A method according to claim 1 or 2, wherein the heat treatment is carried out by a furnace annealing or a lamp annealing.

8. A method of manufacturing a bottom gate type semiconductor device, said method comprising the steps of:

forming a gate electrode, a gate insulating film, and an amorphous semiconductor film over a substrate having an insulating surface;

heating said amorphous semiconductor film to form a crystalline semiconductor film;

adding an impurity comprising an element selected from group 15 elements into the crystalline semiconductor film wherein a first portion of said crystalline semiconductor film is added with said element at a higher concentration than a second portion of said crystalline semiconductor film, said second portion located between said first portion and said gate insulating film;

heating the crystalline semiconductor film added with said impurity so that a catalytic element residing in the second portion moves into said first portion;

forming a source electrode and a drain electrode over the crystalline semiconductor film; and etching a part of the crystalline semiconductor film to a depth corresponding to a thickness of said first portion using the source electrode and the drain electrode as a mask to form a channel forming region in said second portion.

9. A method of manufacturing a bottom gate type semiconductor device, said method comprising the steps of:

forming a gate electrode, a gate insulating film, and an amorphous semiconductor film over a substrate having an insulating surface;

heating said amorphous semiconductor film to form a crystalline semiconductor film;

adding an impurity comprising an element selected from group 15 elements into the crystalline semiconductor film wherein a first portion of said crystalline semiconductor film is added with said element at a higher concentration than a second portion of said crystalline semiconductor film, said second portion located between said first portion and said gate insulating film;

heating the crystalline semiconductor film added with said impurity so that a catalytic element residing in the second portion moves into said first portion;

forming a source electrode and a drain electrode over the crystalline semiconductor film; and etching a part of the crystalline semiconductor film to a depth corresponding to a thickness of said first portion using the source electrode and the drain electrode as a mask to form a channel forming region in said second portion adding an impurity for controlling a threshold voltage using the source electrode and the drain electrode as a mask.

10. A method according to claim 8 or 9, wherein the impurities selected from only group 15 are phosphorus, and the impurities selected from group 13 and group 15 are boron and phosphorus.

11. A method according to claim 10, wherein the step of adding the impurities is carried out by an ion implantation method or an ion doping method.

12. A method of manufacturing a semiconductor device according to claim 8 or 9, wherein the heat treatment is carried out by a furnace annealing or a lamp annealing.

13. A method according to any one of claims 1, 2, 8 and 9, wherein at least said gate insulating film and said amorphous semiconductor film are formed continuously.

14. A method according to claim 13, wherein the continuous forming steps are performed in a multi-chamber.

15. A method according to claim 13, wherein the continuous forming steps are performed in a single chamber.

16. A method of manufacturing a semiconductor device comprising the steps of:

forming a gate electrode, a gate insulating film and an amorphous semiconductor film on an insulating surface;

heating the amorphous semiconductor film to form a crystalline semiconductor film;

introducing an impurity including one element selected from at least group 15 to an entire surface of the crystalline semiconductor film;

forming a source electrode and a drain electrode over the crystalline semiconductor film; and etching a part of the crystalline semiconductor film using the source electrode and the drain electrode as a mask to form a channel forming region, wherein a concentration profile of the impurity in the crystalline semiconductor film continuously decreases from an upper interface to a lower interface of the crystalline semiconductor film in the impurity introducing step, wherein the lower interface is an interface between the gate insulating film and the crystalline semiconductor film.

17. A method of manufacturing a semiconductor device, said method comprising the steps of:

forming a gate electrode, a gate insulating film and an amorphous semiconductor film over an insulating surface;

introducing a catalytic element for promoting crystallization of the amorphous semiconductor film thereto;

heating said amorphous semiconductor film to form a crystalline semiconductor film;

adding an impurity comprising an element selected from group 15 elements into the crystalline semiconductor film to a depth not larger than a thickness of the crystalline semiconductor film;

forming a source electrode and a drain electrode over the crystalline semiconductor film; and etching the crystalline semiconductor film to the depth so that a channel forming region remains between the source electrode and the drain electrode, wherein a concentration of the impurity in the crystalline semiconductor film continuously decreases from an upper interface to a lower interface of the crystalline semiconductor film in the impurity adding step;

wherein the lower interface is an interface between the gate insulating film and the crystalline semiconductor film.

18. A method of manufacturing a semiconductor device, said method comprising the steps of:

forming a gate electrode, a gate insulating film and an amorphous semiconductor film over an insulating surface;

introducing a catalytic element for promoting crystallization of the amorphous semiconductor film thereto;

heating said amorphous semiconductor film to form a crystalline semiconductor film;

adding an impurity comprising an element selected from group 15 elements into the crystalline semiconductor film to a depth not larger than a thickness of the crystalline semiconductor film;

patterning the crystalline semiconductor film to form at least an island-like semiconductor film;

forming a source electrode and a drain electrode over the island-like semiconductor film; and etching the island-like semiconductor film to the depth so that a channel forming region remains between the source electrode and the drain electrode, wherein a concentration of the impurity in the crystalline semiconductor film continuously decreases from an upper interface to a lower interface of the crystalline semiconductor film in the impurity adding step;

wherein the lower interface is an interface between the gate insulating film and the crystalline semiconductor film.

19. A method of manufacturing a semiconductor device comprising the steps of:

forming a gate electrode, a gate insulating film and an amorphous semiconductor film on an insulating surface;

introducing a catalyst element for promoting crystallization of the amorphous semiconductor film thereto;

heating the amorphous semiconductor film to form a crystalline semiconductor film;

introducing an impurity including one element selected from at least group 15 to an entire surface of the crystalline semiconductor film;

irradiating the crystalline semiconductor film with a laser to improve crystallinity thereof;

forming a source electrode and a drain electrode over the crystalline semiconductor film; and etching a part of the crystalline semiconductor film using the source electrode and the drain electrode as a mask to form a channel forming region, wherein a concentration profile of the impurity in the crystalline semiconductor film continuously decreases from an upper interface to a lower interface of the crystalline semiconductor film in the impurity introducing step;

wherein the lower interface is an interface between the gate insulating film and the crystalline semiconductor film.

20. A method of manufacturing a semiconductor device, said method comprising the steps of:

forming a gate electrode, a gate insulating film and an amorphous semiconductor film over an insulating surface;

introducing a catalytic element for promoting crystallization of the amorphous semiconductor film thereto;

heating said amorphous semiconductor film to form a crystalline semiconductor film;

adding an impurity comprising an element selected from group 15 elements into the crystalline semiconductor film to a depth not larger than a thickness of the crystalline semiconductor film;

irradiating the crystalline semiconductor film with a laser to improve crystallinity thereof;

forming a source electrode and a drain electrode over the crystalline semiconductor film; and etching the crystalline semiconductor film to the depth so that a channel forming region remains between the source electrode and the drain electrode, wherein a concentration of the impurity in the crystalline semiconductor film continuously decreases from an upper interface to a lower interface of the crystalline semiconductor film in the impurity adding step;

wherein the lower interface is an interface between the gate insulating film and the crystalline semiconductor film.

21. A method of manufacturing a semiconductor device, said method comprising the steps of:

forming a gate electrode, a gate insulating film and an amorphous semiconductor film over an insulating surface;

heating said amorphous semiconductor film to form a crystalline semiconductor film;

adding an impurity comprising an element selected from group 15 elements into the crystalline semiconductor film to a depth not larger than a thickness of the crystalline semiconductor film;

patterning the crystalline semiconductor film to form at least an island-like semiconductor film;

irradiating the crystalline semiconductor film with a laser to improve crystallinity thereof;

forming a source electrode and a drain electrode over the island-like semiconductor film; and etching the island-like semiconductor film to the depth so that a channel forming region remains between the source electrode and the drain electrode, wherein a concentration of the impurity in the crystalline semiconductor film continuously decreases from an upper interface to a lower interface of the crystalline semiconductor film in the impurity adding step;

wherein the lower interface is an interface between the gate insulating film and the crystalline semiconductor film.

22. A method of manufacturing a semiconductor device according to claim 8, further comprising a step of providing the amorphous semiconductor film with a metal containing material for promoting crystallization thereof.

23. A method of manufacturing a semiconductor device according to claim 20, further comprising a step of providing the amorphous semiconductor film with a metal containing material for promoting crystallization thereof.

24. A method of manufacturing a semiconductor device according to claim 16, further comprising a step of providing the amorphous semiconductor film with a metal containing material for promoting crystallization thereof.

25. A method of manufacturing a semiconductor device according to claim 21, further comprising a step of providing the amorphous semiconductor film with a metal containing material for promoting crystallization thereof.

26. A method of manufacturing a semiconductor device according to claim 22, wherein the metal is at least an element selected from the group consisting of Ni, Ge, Pt, Co, Fe, Au, Pd, Pb, and Cu.

27. A method of manufacturing a semiconductor device according to claim 23, wherein the metal is at least an element selected from the group consisting of Ni, Ge, Pt, Co, Fe, Au, Pd, Pb, and Cu.

28. A method of manufacturing a semiconductor device according to claim 24, wherein the metal is at least an element selected from the group consisting of Ni, Ge, Pt, Co, Fe, Au, Pd, Pb, and Cu.

29. A method of manufacturing a semiconductor device according to claim 25, wherein the metal is at least an element selected from the group consisting of Ni, Ge, Pt, Co, Fe, Au, Pd, Pb, and Cu.

30. A method of manufacturing a semiconductor device according to claim 1, wherein the impurity is added with an entire surface of the crystalline semiconductor film.

31. A method of manufacturing a semiconductor device according to claim 2, wherein the impurity is added with an entire surface of the crystalline semiconductor film.

32. A method of manufacturing a semiconductor device according to claim 8, wherein the impurity is added with an entire surface of the crystalline semiconductor film.

33. A method of manufacturing a semiconductor device according to claims 9, wherein the impurity is added with an entire surface of the crystalline semiconductor film.

34. A method of manufacturing a semiconductor device according to claim 17, wherein the impurity is added with an entire surface of the crystalline semiconductor film.

35. A method of manufacturing a semiconductor device according to claim 18, wherein the impurity is added with an entire surface of the crystalline semiconductor film.

36. A method of manufacturing a semiconductor device according to claim 20, wherein the impurity is added with an entire surface of the crystalline semiconductor film.

37. A method of manufacturing a semiconductor device according to claim 21, wherein the impurity is added with an entire surface of the crystalline semiconductor film.

* * * * *